US 6,657,230 B1

(12) United States Patent
Murade

(10) Patent No.: US 6,657,230 B1
(45) Date of Patent: Dec. 2, 2003

(54) ELECTRO-OPTICAL DEVICE HAVING A SYMMETRICALLY LOCATED CONTACT HOLE AND METHOD OF PRODUCING THE SAME

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/600,701

(22) PCT Filed: Nov. 30, 1999

(86) PCT No.: PCT/JP99/06719

§ 371 (c)(1),
(2), (4) Date: Jul. 21, 2000

(87) PCT Pub. No.: WO00/33285

PCT Pub. Date: Jun. 8, 2000

(30) Foreign Application Priority Data

Nov. 30, 1998 (JP) .................................. 10-339611

(51) Int. Cl.[7] .................................................. H01L 29/04
(52) U.S. Cl. ...................... 257/72; 257/59; 257/291; 257/435; 257/443; 257/448; 257/457; 257/459
(58) Field of Search .......................... 257/59, 72, 291, 257/435, 443, 448, 457, 459

(56) References Cited

U.S. PATENT DOCUMENTS 6,136,624 A * 10/2000 Kemmochi et al. .......... 438/30
6,166,792 A * 12/2000 Miyawaki et al. .......... 349/113
6,172,721 B1    1/2001 Murade et al.
6,249,327 B1    6/2001 Murade et al.
6,297,862 B1 * 10/2001 Murade ........................ 349/44

FOREIGN PATENT DOCUMENTS

JP    A-6-67201       3/1994
JP    A-8-160463      6/1996
JP    09-043639    *  2/1997  ........... G02F/1/136
JP    A-10-20298      1/1998
JP    A-10-31235      2/1998

* cited by examiner

Primary Examiner—Eddie Lee
Assistant Examiner—Matthew E. Warren
(74) Attorney, Agent, or Firm—Oliff & Berridge, PLC

(57) ABSTRACT

An electro-optical device such as an active-matrix-driven liquid crystal device is improved to suppress undesirable effects of dents and steps that appear on pixel electrode surfaces due to presence of contact holes that interconnect a semiconductor layer and pixel electrodes through the intermediary of a conductive layer. The liquid crystal device has a TFT array substrate carrying a TFT, data lines, scanning lines, capacitance lines and pixel electrodes. The pixels and TFTs are electrically connected via contact holes through the intermediary of barrier layers. At least each contact hole is formed in a non-aperture region at a position symmetrical with respect to two adjacent data lines.

33 Claims, 20 Drawing Sheets

ELECTRO-OPTICAL DEVICE HAVING A SYMMETRICALLY LOCATED CONTACT HOLE AND METHOD OF PRODUCING THE SAME

BACKGROUND OF THE INVENTION

1. Field of the Invention

The present invention relates to an electro-optical device of the type driven by an active matrix, as well as to the method of producing such an electro-optical device. More particularly, the present invention pertains to a technical field of an electro-optical device having a conductive layer which serves to provide excellent electrical connection between pixel electrodes and pixel-switching thin film transistors (referred to as "TFT", hereinafter), and also to a method of producing the electro-optical device.

2. Description of Related Art

Hitherto, an electro-optical device of the type driven by a TFT active matrix has a TFT array substrate on which numeral scanning lines and data lines which run in orthogonal directions in a crossing manner are arranged. Numerous TFTs disposed at the points where the scanning lines and data lines cross each other are also arranged. Each TFT has a gate electrode connected to one of the scanning lines and has a semiconductor layer, the source region of which is connected to a data line, while the drain region of the semiconductor layer is connected to the pixel electrode.

The source region, the drain region, and an intervening channel region therebetween are constituted by a semiconductor layer formed on a TFT array substrate. The pixel electrode has to be connected to the drain region of the semiconductor layer, across the laminate structure including the scanning line, capacitance line, data line and a plurality of inter-layer insulation films which serve to electrically isolate these lines from one another. The interlayer distance between the semiconductor layer of the laminate structure and the pixel electrode is as long as 1000 nm or greater, particularly in the case of a positive stagger-type having a top-gate structure, in which a gate is provided on the semiconductor layer formed on a TFT array substrate, or in case of a coplanar-type polysilicon TFT. This makes it difficult to form a contact hole through which the semiconductor layer and the pixel electrode are to be electrically connected to each other. More specifically, a greater depth of etching correspondingly impairs the etching precision, posing a risk of the semiconductor layer being undesirably penetrated and perforated, although the etching has to be stopped upon reaching the semiconductor layer. It is therefore extremely difficult to form such a deep contact hole by a dry etching process alone. One solution is to use both dry etching and wet etching in combination, but such a solution inevitably enlarges the diameter of the contact hole due to the use of the wet etching process, making it difficult to lay out necessary wiring and electrodes in restricted areas available on the substrate.

Under this circumstance, a currently developed technique employs, when achieving electrical connection between a data line and a source region via a contact hole formed in an interlayer insulating film formed on the scanning lines and leading to the source region, a contact hole formed in this inter-layer insulating film and reaching a drain region, a relaying conductive layer generally referred to as a barrier layer and formed on the interlayer insulating film and constituting the same layer as the data line, an additional interlayer insulating film formed on the data line and the barrier layer, and a contact hole formed in the additional inter-layer insulating film and extending from a pixel electrode to the barrier layer, whereby the pixel electrode is connected to the drain region.

In the meantime, a multi-plate-type color projector has been developed which incorporates three units of electro-optical devices such as a liquid crystal display device of the type described above, the three units respectively serving as a red (R) light valve, a green (G) light valve and a blue (B) light valve. For instance, as shown in FIG. 20, the three units of electro-optical devices 500R, 500G and 500B individually perform optical modulation so as to produce light rays of three colors which are then synthesized by a prism 502 to form composite light rays which are then projected on a screen. The synthesis of light rays by the prism 502 involves a problem in that the green light G is not reflected by the prism 502 while the red R and blue B light rays are by the prism 502. Consequently, the green light G undergoes turns of a number which is smaller by one than the number of turns sustained by the red and blue light rays R and B. Obviously, this problem occurs when the optical system is arranged such that the R light or the B light, rather than the G light, pass through the prism without being reflected. The same problem is encountered also when the light rays of the three colors are synthesized into the projected light by means of an optical element used as a substituent for the prism 502, e.g., a dichroic mirror. In this occasion, the electro-optical device 500G for the green color light rays is arranged to cause inversion of image signals from left to right and vice versa by a suitable means, and is driven in such a manner that the scanning direction is reversed to that employed in the electro-optical devices 500R and 500B, thus displaying an inverted image.

The electro-optical devices of the kind described is now facing an increasing demand for higher quality of the displayed images. To meet such a demand, critical factors are higher degree of definition or resolution of the image display area or implementation of micro-fine pixel pitch, as well as a high pixel aperture ratio, i.e., to increase in each pixel the ratio of the light-transmitting aperture area to the non-aperture area which blocks light rays. Implementation of micro-fine pixel pitch, however, poses another problem: namely, since the production technique limits refining of geometric factors such as electrode size, line width and contact-hole diameter, the pixel aperture ratio is undesirably reduced when the pixel pitch is made smaller, as a result of increase of the ratio of the area occupied by the lines, electrodes and so on.

Another problem accompanying the micro-finer pixel pitch is as follows. From the view point of production technique, there also is a limit in the reduction of thicknesses of the TFTs and conductive layers such as those serving as data lines, scanning lines and capacitance lines, as well as thicknesses of intervening inter-layer insulation films. Consequently, the size of a step or height difference appearing on the surface of each pixel electrode, between an area where a line or an element is formed and an area devoid of such line and element, is increased as a matter of comparison with other dimensions. Rubbing of an oriented film having a step generates a liquid crystal disclination region. The above-mentioned relative increase of the step height correspondingly increases the area of such disclination region. Consequently, the disclination region protrudes out of the non-aperture region which surrounds the aperture region of each pixel in a manner like a grating. A solution to this problem might be to cover and conceal the entire disclination region by a light-shield film formed on a counter substrate. Such a solution, however, excessively reduce the area of the aperture region in each pixel, thus posing another problem.

Experiments and studies made by the present inventor proves that the location and extent of disclination caused by the presence of a step on the pixel electrode surface largely depend on the direction of rubbing. It is assumed here that a TN (Twisted Nematic) liquid crystal is used. In such a case, when the TN liquid crystal has clockwise twisting direction as viewed from the counter substrate, rubbing performed in the directions of scanning lines and data lines causes a greater disclination region to appear at the right end portion of the aperture region of each pixel, as a result of the presence of a step on the pixel electrode surface. Conversely, when the TN liquid crystal has counterclockwise twisting direction as viewed from the counter substrate, rubbing causes a greater disclination region to appear at the left end portion of the aperture region of each pixel, as a result of the presence of a step on the pixel electrode surface. Such a disclination having directivity may not be recognizable in a single unit of electro-optical device, but may become noticeable in a multi-plate-type color projector which projects light rays synthesized from the light rays of three different colors produced by three units of electro-optical device. More specifically, the color projector synthesizes three different colors modulated by the respective units electro-optical device, wherein two (units 500R and 500B of FIG. 20) of the units have the same tendency of generation of disclination regions, while the remainder (unit 500G) has the opposite tendency. In this case, the disclination may be locally superimposed and enhanced at a certain location on each pixel to an extent which is highly conspicuous to eyes. In particular, production of a multi-plate-type color projector, employing three units of electro-optical device having a very fine pixel pitch, suffers from a very high rate of production of defective products. Similarly, a multi-plate-type color projector having three units of electro-optical device having a very fine pixel pitch suffers from very heavy deterioration of the image due to disclination attributable to the presence of a step on the surface of each pixel electrode. This makes it extremely difficult to display high-quality image.

The aforementioned technique which uses a barrier layer, it is necessary that at least two contact holes be formed in the non-aperture region, in order to achieve electrical connection between the drain region and the pixel electrode of each pixel. Such two contact holes inevitably produce a plurality of dents or steps on the surface of the pixel electrode overlying these contact holes. Various planarization techniques are usable to remove such dents or steps, but such a measure undesirably complicates the production process and raises the cost of production. Moreover, it impossible to planarize the portion of the pixel electrode surface formed of, for example, an ITO (Indium Tin Oxide) film and overlying a second contact hole that is directly connected to the pixel electrode, although other interlayer insulating films and underlying layers may satisfactorily planarized. Consequently, disclination of liquid crystal inevitably appears at a certain location of each pixel, as a result of formation of dents and steps in the pixel electrode surface, due to the presence of a plurality of contact holes. Alternatively, it is necessary to reduce the area of the aperture region.

In view of the foregoing, it is an object of the present invention to provide an electro-optical device, as well as a method of producing the same, which despite a very fine pixel pitch effectively suppresses undesirable effect of dents and steps formed on each pixel electrode surface due to presence of a plurality of contact holes interconnecting a semiconductor layer and the pixel electrode, thus realizing a high aperture ratio of each pixel and, at the same time, high quality of displayed images.

In order to solve the problems described heretofore, the present invention provides an electro-optical device, which may consist of a substrate on which are formed a plurality of scanning lines, a plurality of data lines, thin-film transistors and pixel electrodes arranged at positions corresponding to the points where the scanning lines and data lines cross each other; and at least one conductive layer electrically connected between a semiconductor layer constituting the thin-film transistor and the pixel electrode, wherein a first contact hole for providing electrical connection between the pixel electrode and the conductive layer is formed in symmetry with respect to two adjacent data lines when viewed in plan.

In accordance with these features of the present invention, the first contact hole for providing electrical connection between the pixel electrode and the conductive layer is formed in symmetry with respect to two adjacent data lines when viewed in plan. The expression "position symmetrical with respect to two adjacent data lines" means, if only one first contact hole exists, the position which is midst between two data lines and, if there are two first contact holes, two positions which are line-symmetry with each other with respect to the central axis line of the region between the two adjacent data lines. Thus, various positions are defined by this expression depending on the number of the second contact holes. The positions symmetrical with respect to two adjacent data lines usually conform with two positions that are symmetrical with each other with respect to the axis line of the pixel aperture extending in the direction of the data line. However, in some cases, the central axis line of the pixel aperture extending in the direction of the data lines cannot definitely be determined unless the pixel aperture has such a configuration as square or rectangular. Thus, the positions symmetrical with respect to two adjacent data lines do not always coincide with the above-mentioned two positions. The first contact hole reaches the pixel electrode and, therefore, dents and steps are more or less caused to appear on the surface of the pixel electrode, at a position where the first contact hole exists, insofar as the presently available production technique is used. Unlike planar portions, the portion where such dents and steps exist causes various undesirable effect on the electro-optical substance, such as disclination of the electro-optical substance after a treatment such as rubbing effected on an alignment film formed on the pixel electrode. In accordance with the present invention, however, the dents and steps in each pixel corresponding to the first contact hole appear at positions symmetrical with respect to the two adjacent data lines, because the contact hole is formed at the position symmetrical with respect to these two adjacent data lines. It is assumed here that a rubbing treatment is effected on the alignment film formed on the pixel electrode, both in the direction for clockwise TN liquid crystal and in the direction for counterclockwise TN liquid crystal. In the present invention, for the reason stated above, any defect of the electro-optical substance due to the presence of the dents and steps on the pixel electrode surface appears in the constant and same tendency, regardless of the rubbing direction, in each and all pixels. It is therefore possible to avoid a risk conventionally encountered with the multi-plate type color projector having a plurality of units of the electro-optical device having different directions of distinctive vision (see FIG. 20), i.e., the risk that defects may be enhanced at certain locations due to superposition. In a more general sense, the dents and steps on the pixel electrode surface of each pixel caused by the presence of the first contact hole do not deviate from the center in either direction along the scanning line. Therefore, any unevenness of display having directivity in the direction of the scanning line is prevented from appearing on the entire image display area. Thus, the requirement of the position being symmetrical with respect to the data lines is sufficiently met if the symmetry is achieved to such an extent that generation of display unevenness having directivity in the direction of the scanning lines is substantially eliminated.

In accordance with the present invention, a second contact hole arranged between the conductive layer and the semiconductor layer for providing electrical connection between the conductive layer and the semiconductor layer is formed in symmetry with respect to two adjacent data lines when viewed in plan.

According to this feature of the invention, the drain region of the semiconductor layer and the conductive layer are electrically connected to each other through the second contact hole. It will be appreciated that each of the contact holes can have a diameter smaller than that of a single, continuous, long contact hole which is used to provide electrical connection between the pixel electrode and the drain region. More specifically, the etching precision is impaired when the depth of the contact hole increases. In order to prevent penetration of the thin semiconductor layer, it is necessary to set up the etching process such that dry etching which enables formation of a contact hole of a small diameter be stopped midway the etching process and be substituted by wet etching which progressively proceeds to reach the semiconductor layer. This wet etching having no directivity inevitably increases the diameter of the contact hole. In contrast, in this embodiment, the electrical connection between the pixel electrode and the semiconductor layer is achieved by a pair of contact holes that are arranged to provide a series connection. Each of these contact holes can fully be formed by dry etching or, if not, the distance or the hole depth which has to be processed by wet etching can be minimized. It will be understood that the present invention makes it possible to reduce the diameter of each of the contact holes. This correspondingly reduces dimensions of dents and steps which appear on the surface of the conductive layer at the location right above the contact hole. This contributes to planarization of the corresponding portion of the overlying pixel electrode. Further, the dents and steps appearing on the surface of the pixel electrode at the location right above the contact hole can also be reduced, contributing to the planarization of the pixel electrode at this position.

The second contact hole is spaced apart from the pixel electrode by the intervening conductive layers and inter-layer insulating films, so that the influence produced by the second contact hole on the surface state of the pixel electrode is not so critical as compared with the influence produced by the first contact hole. It is, however, conceivable that dents and steps caused by the presence of the second contact hole produces a certain undesirable effect such as generation of disclination of the electro-optical substance, due to reasons attributable to the specifications of the device (required image quality) and the device design requirement (position of the second contact hole and distance of the second contact hole from the pixel aperture). In some cases, it may be desirable to omit planarization treatment on the region corresponding to the second contact hole.

Under this circumstance, in accordance with the described feature of the invention, the second contact hole is formed within the non-aperture region at a position symmetrical with respect to two adjacent data lines. This arrangement, as in the case of the first contact hole, prevents the dents and steps appearing on the surface of the pixel electrode corresponding to the first contact hole in each pixel from deviating in either direction along the scanning line, thus avoiding generation of display unevenness having directivity along the scanning lines over the entire image display area.

In accordance with the present invention, a storage capacitor is added to the pixel electrode, and the conductive layer, a first inter-layer insulating film, the data line, a second inter-layer insulating film, and the pixel electrode are laminated in this order on the scanning line and one of the electrodes of the storage capacitor, the conductive layer and the pixel electrode being electrically connected to each other through the first contact hole formed in the first and second inter-layer insulating films.

With this arrangement, the connection between the semiconductor layer and the data line is achieved through the intermediary of the conductive layer, whereby the electrical connection is obtained between the conductive layer and the pixel electrode via the first contact hole. The first contact hole can be located anywhere on the planar region except the region where the data lines exist, thus enhancing the degree of freedom of the design.

In accordance with the present invention, a first insulating thin film constituting a first dielectric film is provided between a first storage capacitor electrode constituted by the same film as the semiconductor layer and a second storage capacitor electrode which constitutes the one of the electrodes of the storage capacitor, and a second insulating thin film constituting a second dielectric film is provided between the second storage capacitor electrode and a third storage capacitor electrode constituted by part of the conductive layer.

With these features, the first insulating thin film is provided between the first storage capacitor electrode constituted by the same film as the semiconductor layer and the second storage capacitor electrode which constitutes the one of the electrodes of the storage capacitor, and the second insulating thin film is provided between the second storage capacitor electrode and the third storage capacitor electrode constituted by part of the conductive layer. Therefore, a first storage capacitor and a second storage capacitor, that are coupled in parallel, are formed on upper and lower sides of the conductive layer. It is therefore possible to enhance the storage capacitor by three-dimensionally using the conductive layer within a limited region on the substrate.

In accordance with the present invention, a storage capacitor is added to the pixel electrode, and a first inter-layer insulating film, the data line, the conductive layer, a second inter-layer insulating film, and the pixel electrode are laminated in this order on the scanning line and one of the electrodes of the storage capacitor, the conductive layer and the pixel electrode being electrically connected to each other through the first contact hole formed in the second inter-layer insulating film.

With this arrangement, the connection between the semiconductor layer and the data line is achieved through the intermediary of the conductive layer, whereby the electrical connection is obtained between the conductive layer and the pixel electrode via the first contact hole. The first contact hole can be located anywhere on the planar region except the region where the data lines exist, thus enhancing the degree of freedom of the design. Further, it is possible to simultaneously form the conductive layer and the data lines. This means that the data lines can be formed without increasing the number of the process steps. When the data lines are formed of Al films, there is a risk that the connections between these data lines and the ITO films constituting the pixel electrodes may be impaired. To obviate this problem, the conductive layer may be formed to have two or more layers.

In accordance with the present invention, a storage capacitor is added to the pixel electrode, and a first dielectric film is provided between a first storage capacitor electrode constituted by the same film as the semiconductor layer and a second storage capacitor electrode which constitutes the one of the electrodes of the storage capacitor, and the first inter-layer insulating film constituting a second dielectric film is provided between the second storage capacitor electrode and a third storage capacitor electrode constituted by part of the conductive layer.

With these features, a first dielectric film is provided between a first storage capacitor electrode constituted by the same film as the semiconductor layer and a second storage capacitor electrode, and the first inter-layer insulating film constituting a second dielectric film is provided between the second storage capacitor electrode and a third storage capacitor electrode constituted by part of the conductive layer. Therefore, a first storage capacitor and a second storage capacitor, that are coupled in parallel, are formed on upper and lower sides of the conductive layer. It is therefore possible to enhance the storage capacitor by three-dimensionally using the conductive layer within a limited region on the substrate.

In accordance with the present invention, the scanning line and the second storage capacitor electrode are arranged substantially side-by-side when viewed in plan, and a second contact hole for providing electrical connection between the semiconductor layer and the conductive layer is formed at a position which is between the scanning line and the second storage capacitor electrode when viewed in plan.

This arrangement serves to prevent short-circuiting between the scanning lines and the second storage capacitor electrode, and the conductive layer which is electrically connected to the drain region of the semiconductor layer. The second contact hole leads to the semiconductor layer and, hence, cannot be positioned to overlap the scanning lines and the second storage capacitor electrode when viewed in plan. In accordance with the described feature of the present invention, the second contact hole is formed at a position between the scanning line and the second storage capacitor electrode when viewed in plan, whereby the above-mentioned short-circuit is prevented. In addition, dents and steps on the surface of the pixel electrode above the second contact hole due to the presence of this second contact hole are concentrated to a central portion between the scanning line and the capacitor line. Consequently, the dents and steps of the surface of the pixel electrode attributable to the presence of the second contact hole can be retracted apart from the aperture region of the pixel into the non-aperture region. Consequently, the dents and steps caused by the presence of the contact hole can hardly affect the aperture region, even when no planarization treatment is effected on the intervening layers such as the interlayer insulating films.

In accordance with the present invention, the scanning line and the second storage capacitor electrode are arranged substantially side-by-side when viewed in plan, and a second contact hole for providing electrical connection between the semiconductor layer and the conductive layer is formed at a position on the second storage capacitor electrode adjacent to the aperture region of the pixel when viewed in plan.

With these features, the second contact hole is formed at a position on the second storage capacitor electrode adjacent to the aperture region of the pixel when viewed in plan. The second contact hole reaches the semiconductor layer of the thin film transistor and, therefore, cannot be formed at a position where it overlaps the scanning line and the second storage capacitor electrode when viewed in plan. Namely, if such an overlap is allowed, the scanning line and the second storage capacitor electrode may be short-circuited to the conductive layer via the second contact hole. In accordance with the present invention, however, the risk of short-circuiting between the scanning line and the conductive layer, which is critical in the electro-optical device, is minimized, because the second contact hole is formed on the region of the second storage capacitor electrode adjacent to the pixel aperture when viewed in plan. Unlike the first contact hole, the second contact hole is spaced apart from the electrode, by a plurality of intervening layers such as the conductive layer and inter-layer insulating films. Therefore, the dents and steps appearing transferred from the second contact hole through the intervening layers to appear on the pixel electrode surface are inherently rather small. In case of the first contact hole, dents and steps are substantially inevitably formed to appear on the pixel electrode surface, and planarization to remove such dents and steps is extremely difficult. In contrast, the dents and steps attributable to the second contact hole can be removed to allow planarization relatively easily, through the intervening layers that intervene between the second contact hole and the pixel electrode. Therefore, by planarizing the inter-layer insulating films above the second contact hole as required, it is possible to reduce the risk of short-circuiting between the scanning line and the conductive layer attributable to the presence of the second contact hole, when the first contact hole is located, as described above, on the side of the second storage capacitor electrode contacting the aperture region, i.e., at a position near the aperture region of each pixel, when viewed in plan. In accordance with the present invention, wherein at least one of the first and second contact holes is arranged in plural for each of the pixels.

Provision of a plurality of contact holes effectively reduces the diameter of each contact hole for obtaining the same electrical conduction. Consequently, the sizes of the dents and steps appearing on the pixel electrode surface due to the presence of such contact holes can advantageously be reduced. Further, a redundant structure can be implemented by the plural contact holes, thus reducing the ratio of production of defective products.

In accordance with the present invention, the first contact hole is disposed substantially midst the width between the scanning line and the second storage capacitor electrode when viewed in plan.

With this feature, the first contact hole is disposed substantially midst the width between the scanning line and the second storage capacitor electrode when viewed in plan. Therefore, the dents and steps appearing on the pixel electrode surface due to the presence of the first contact hole are concentrated to the widthwise central portion of the non-aperture region extending along the scanning line. Consequently, the dents and steps due to the presence of the first contact hole becomes less likely to affect the pixel aperture region. Thus, in this embodiment, the requirement for the contact hole being located midst is sufficiently met if the contact hole is retracted into the non-aperture region away from the aperture region to such an extent that the undesirable effect on the aperture region caused by the dents and steps attributable to the second contact hole is substantially reduced.

In accordance with the present invention, the first contact hole and the second contact hole are arranged to overlap at least partially when viewed in plan.

With this arrangement, since the first contact hole and the second contact hole are arranged to overlap at least partially, it is possible to obtain symmetry of the pixel. In addition, the steps formed due to the presence of the contact holes can be concentrated to a certain area, whereby generation of disclination in the electro-optical material such as liquid crystal can be suppressed.

In accordance with the present invention, the aforesaid one of the electrodes of the storage capacitor is a capacitance line to which a predetermined potential is applied.

This arrangement serves to maintain the potential of the capacitance line at a constant level, thus stabilizing the potential of the second storage capacity.

In accordance with the present invention, the conductive layer is arranged to be substantially in symmetry with respect to the central axis line of the region between adjacent data lines.

This arrangement eliminates any deviation of the dents and steps appearing on each pixel surface, thus preventing generation of display unevenness over the entire image display area.

In accordance with the present invention, at least one of the first and second interlayer insulating film is recessed at least at a portion confronting part of the data line, or at least one of the first and second inter-layer has been subjected to a planarizing treatment so as to planarize the surface of the pixel electrode.

This effectively reduces the height difference between the region having the thin film transistor, scanning line, second storage capacitor electrode and so forth formed above the data line and other region. Thus, at least one of the first and second inter-layer insulating films is planarized at its surface facing the pixel electrode, including the portion confronting the first contact hole, by a suitable technique such as CMP (Chemical Mechanical Polishing), spin-coat processing or reflow processing, while using an organic SOG (Spin On Glass) film, inorganic SOG film, polyimide film or the like. Alternatively, at least one of the first and second inter-layer insulating film is recessed. By using one of these measures, the surface of the undercoating layer beneath the pixel electrode is planarized, thus allowing further planarization of the pixel electrode. This effectively suppresses undesirable effect such as generation of disclination in the electro-optical material such as liquid crystal attributable to dents and steps on the pixel electrode surface, thus leading finally to high quality of displayed images.

In accordance with the present invention, the conductive layer is formed from a conductive light-shielding film.

With this arrangement, the conductive layer made of a conductive light-shielding film can define the aperture region of each pixel at least partially. In this form of the invention, the light shielding film does not require a light-shielding film formed on the counter substrate which opposes the TFT array substrate. Rather, part or the entirety of the conductive light-shielding film is formed on the TFT array substrate itself. This arrangement is highly advantageous because it does not incur any reduction in the pixel aperture ratio which otherwise may be caused due to misalignment between the TFT array substrate and the counter substrate during the production process.

In accordance with the invention, the conductive layer may be arranged to define at least part of the aperture region of the pixel.

This arrangement makes it possible to define the pixel aperture region by the conductive film alone or in cooperation with a light-shielding film or the like formed on the counter substrate. Defining the aperture region without the aid of a light-shielding film formed on the counter substrate serves to reduce the number of the production process steps, and advantageously reduce the reduction and fluctuation of the aperture ratio attributable to misalignment between the pair of substrates.

In accordance with the present invention, the conductive layer is formed of a conductive polysilicon film.

With this feature, the conductive layer formed of the conductive polysilicon layer satisfactorily plays the role of the intermediary for the electrical connection between the pixel electrode and the drain region of the semiconductor layer, although it does not function as a light-shielding film. In particular, this feature suppresses generation of thermal stress at the interface between the conductive layer and the inter-layer insulating film, thus suppressing cracking of the conductive layer and other portions therearound.

In accordance with the present invention, the conductive layer has a laminate film having at least two layers including a conductive silicon film and a high-melt-point metal.

With this feature, the conductive layer formed of the conductive polysilicon layer satisfactorily plays the role of the intermediary for the electrical connection between the pixel electrode and the drain region of the semiconductor layer, although it does not function as a light-shielding film. Further, the use of conductive silicon as the material of the conductive layer remarkably reduces the contact resistance at the point of connection between the conductive layer and the semiconductor layer when the semiconductor layer is formed of the same polysilicon film. Lamination of a high-melt-point metal on this conductive polysilicon layer serves to further reduce the resistance, while ensuring a light-shielding function.

In order to overcome the aforesaid problems, in accordance with the present invention, there is provided a method of producing an electro-optical device of the type having a plurality of scanning lines, a plurality of data lines, thin-film transistors and pixel electrodes arranged at positions corresponding to the points where the scanning lines and data lines cross each other, and at least one conductive layer electrically connected between a semiconductor layer constituting the thin-film transistor and the pixel electrode, the method may consist of the steps of: forming the semiconductor layer on a substrate; forming a first insulating thin film on the semiconductor layer; forming the scanning lines on the first insulating thin film; forming a second insulating thin film on the scanning lines; forming a conductive layer on the second insulating thin film; forming a first inter-layer insulating film on the conductive layer, forming the data lines on the first inter-layer insulating film; forming a second inter-layer insulating film on the data lines; forming the first contact hole in the second inter-layer insulating film at a position substantially symmetrical with respect to two adjacent data lines; and forming the pixel electrode such that electrical connection is achieved between the pixel electrode and the conductive layer via the first contact hole.

The method having these features makes it possible to produce the described first aspect of the electro-optical device of the present invention with fewer and simpler production process steps.

In order to overcome the aforesaid problems, the present invention also provides a method of producing an electro-optical device of the type having a plurality of scanning lines, a plurality of data lines, thin-film transistors and pixel electrodes arranged at positions corresponding to the points where the scanning lines and data lines cross each other, and at least one conductive layer electrically connected between a semiconductor layer constituting the thin-film transistor and the pixel electrode; the method may consist of the steps of: forming the semiconductor layer on a substrate; forming an insulating thin film on the semiconductor layer; forming the scanning lines on the insulating thin film; forming a first inter-layer insulating film on the scanning lines; forming the data lines and the conductive layer on the first inter-layer insulating film; forming a second inter-layer insulating film on the conductive layer; forming the first contact hole in the second interlayer insulating film at a position substantially symmetrical with respect to two adjacent data lines; and forming the pixel electrode such that electrical connection is achieved between the pixel electrode and the conductive layer via the first contact hole.

The method having these features makes it possible to produce the electro-optical device of the present invention with fewer and simpler production process steps.

In accordance with the present invention, the step of forming the scanning lines includes a step of forming one of the electrodes of a storage capacitor added to the pixel electrode, so as to extend along and in side-by-side relation to the scanning line from the same material simultaneously with the formation of the scanning line, the method further may consist of the step of forming a second contact hole at a position between the one of the electrodes of the storage capacitor and the scanning line when viewed in plan.

With these features, it possible to produce the electro-optical device of the present invention with fewer and simpler production process steps.

The above and other operations and advantages of the present invention will become clear from the following description of the preferred embodiments.

DETAILED DESCRIPTION OF THE EMBODIMENTS

Modes for carrying out the present invention will now be described with reference to the drawings.

First Embodiment of Electro-optical Device

A description will be given of a liquid crystal device as a first embodiment of the electro-optical device in accordance with the present invention, with specific reference to FIGS. 1 to 3.

Figure 1:
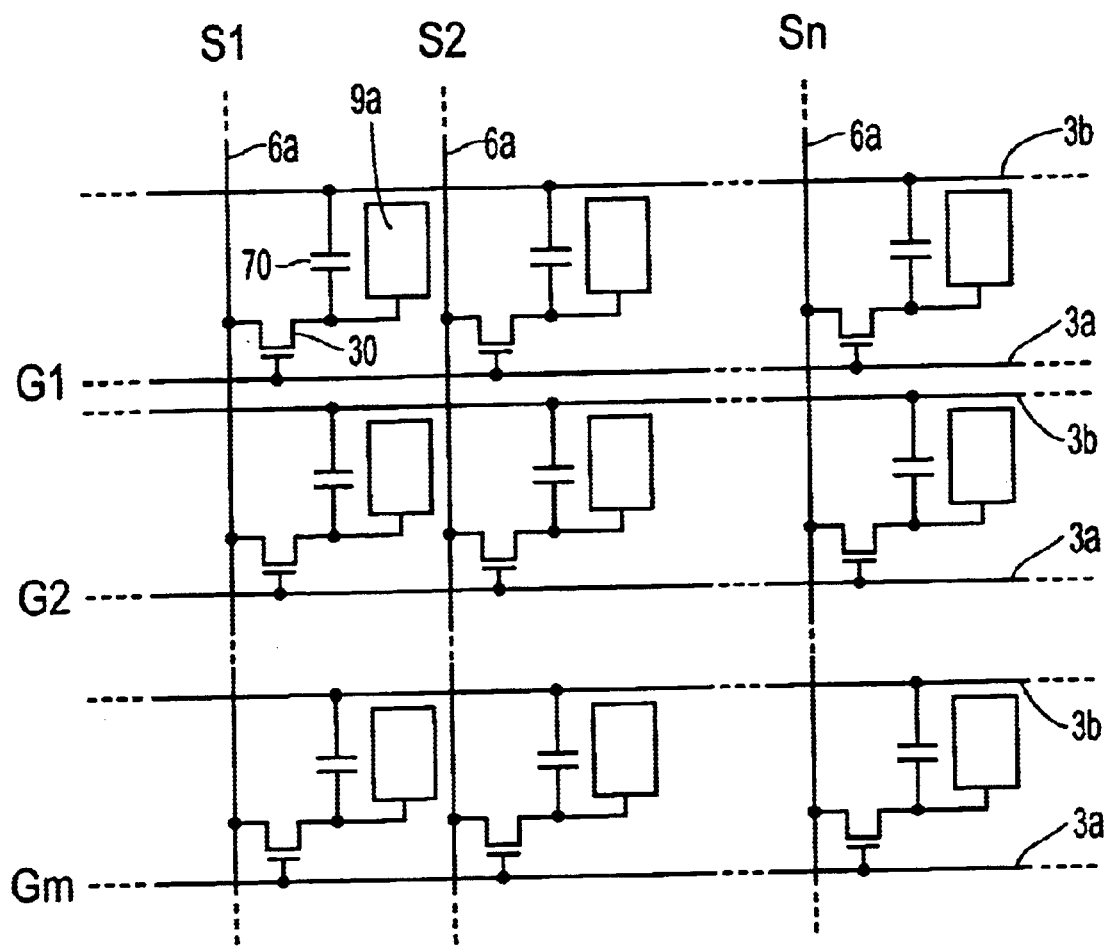
FIG. 1 is a circuit diagram showing a circuitry equivalent to a circuit constituted by various elements and lines associated with a plurality of pixels which are arranged in the form of a matrix and which provide an image display area of a liquid crystal device as an embodiment of the electro-optical device.

FIG. 1 is a circuit diagram showing a circuitry equivalent to a circuit constituted by various elements and lines associated with a plurality of pixels which are arranged in the form of a matrix and which provide an image display area of a liquid crystal device as an embodiment of the electro-optical device. FIG. 2 is a plan view of a plurality of pixels arranged adjacent to one another on a TFT array substrate which carries data lines, scanning lines, a light-shielding film and which is incorporated in the liquid crystal device of the first embodiment. FIG. 3 is a sectional view taken along the line III—III of FIG. 2. In FIG. 3, layers and members are shown at various scales of magnification, in order to make these layers and members visually recognizable on the drawings.

Referring to FIG. 1, a plurality of pixels are arranged in a matrix so as to form an image display area of a liquid crystal device as an embodiment of the electro-optical device. TFTs 30 for controlling pixel electrodes 9a of the pixels are therefore arranged in the form of a matrix. There are a plurality of data lines 6a which carry image signals. Each of the data lines 6a is electrically connected to the source regions of the TFTs 30. Image signals S1, S2, . . . Sn to be written on the data lines 6a may be supplied in a line-sequential manner in this order, or each signal may be supplied to a group of adjacent data lines 6a There are a plurality of scanning lines 3a each of which is electrically connected to the gates of the TFTs. 30. The arrangement is such that scanning pulse signals G1, G2, . . . Gn are supplied at a predetermined period to the successive scanning lines 3a in a line-sequential manner in this order. The pixel electrode 9a is electrically connected to the drain region of the associated TFT 30. The TFTs 30 serve as switching elements. The arrangement is such that each TFT 30 makes the electrical connection for a predetermined period of time, so that the image signals S1, S2, . . . , Sn supplied from the data lines 6a are written in the pixels at predetermined timings. The image signals S1, S2, . . . , Sn of predetermined levels, that have been written in the liquid crystal through the pixel electrodes 9a, are held for a predetermined period of time between the pixel electrodes 9a and later-mentioned counter-electrodes formed on a counter substrate, which also will be described later.

Liquid crystal changes orientation and order of molecular association in accordance with a voltage applied across the liquid crystal, thereby modulating light rays to enable gray scale representation. For instance, when the liquid crystal is used in a normally-white mode, the portion of the liquid crystal where a voltage is applied interrupts the incidents light rays in accordance with the level of a voltage applied across the liquid crystal, whereas, in a normally-black mode, the portion of the liquid crystal allows the incidents light rays to pass therethrough in accordance with the level of the applied voltage. Consequently, the whole liquid crystal device outputs light rays with contrasts corresponding to the image signals applied thereto. A storage capacitor 70 is added to extend in parallel with the liquid crystal capacitance between the pixel electrode 9a and the counter electrode, in order to prevent the image signal held between these electrodes from leaking. For instance, the storage capacitor serves to maintain the potential of the pixel electrode 9a over a period which is three orders of magnitude longer than the period of application of the source voltage. This serves to further improve the storage characteristic, thus implementing liquid crystal devices capable of displaying with high contrast ratios.

Figure 2:
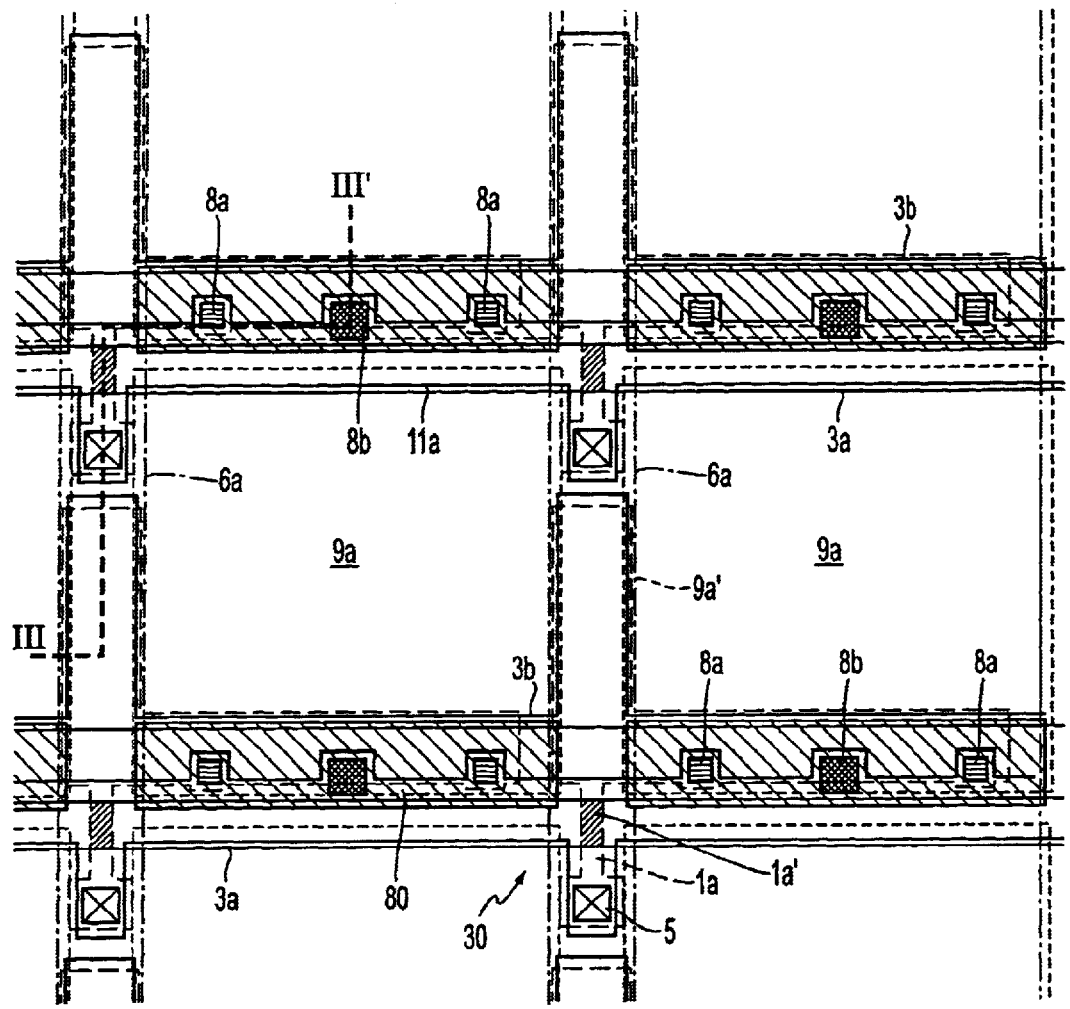
FIG. 2 is a plan view of a plurality of pixels arranged adjacent to one another on a TFT array plate which carries data lines, scanning lines, a light-shielding film and which is incorporated in the liquid crystal device of the first embodiment.

Referring now to FIG. 2, the TFT array substrate of the liquid crystal device carries a plurality of transparent pixel electrodes 9a arranged in a matrix. The contour of each pixel electrode 9a is shown by a dotted line 9a'. The data lines 6a, scanning lines 3a and the capacitance lines 3b are arranged so as to extend along the longitudinal and transverse boundaries of the respective pixel electrodes 9a The data line 6a is electrically connected, via a contact hole 5, to a later-mentioned source region of a semiconductor layer 1a which is composed of, for example, a polysilicon film. A conductive layer (referred to as a "barrier layer", hereinafter) 80 serving as a buffer is formed in each of the regions that are hatched with oblique lines descending towards the right side. The pixel electrode 9a also is electrically connected to a later-mentioned drain region of the semiconductor layer 1a, through the intermediary of the barrier layer 80 and via contact holes 8a and 8b. Each scanning line 3a is laid so as to extend over the channel region 1a' of the semiconductor layer. The portion of the scanning line 3a opposing the channel region 1a' functions as a gate electrode. Thus, each TFT 30 is disposed at each of the points where the data lines 6a and the scanning lines 3a cross each other. Each TFT 30 thus has a channel region 1a' and a gate electrode constituted by a portion of the scanning line 3a opposing the channel region 1a'.

The capacitance line 3b has a main portion which extends substantially straight along the scanning line 3a and a projecting portion which projects towards the upstream stage, i.e., upward as viewed in the Figure, starting from a position where the capacitance line crosses the data line 6a.

Each barrier layer 80 in the form of an island is electrically connected to the drain region of the semiconductor layer 1a and also to the pixel electrode 9a, via the contact hole 8a and the contact hole 8b, respectively, thus serving as a conductor or a buffer between the drain region and the pixel electrode 9a. A detailed description will be given later in connection with the barrier layer 80 and the contact holes 8a and 8b.

A first light-shielding film 11a may be provided to underlie the scanning line 3a, capacitance line 3b and the TFT 30, as shown by thick lines in the figure. The first light-shielding films 11a are preferably formed in the form of stripes extending along the scanning lines. Each first light-shielding film 11a is widened to expand downward as viewed in the figure at a portion thereof crossing the data line 6a The first light-shielding film 11a is so arranged that the above-mentioned widened area covers the channel region 1a' of each TFT when viewed from the TFT array substrate 10, thereby forming a light shield against light rays impinging from the back side of the TFT array substrate.

Figure 3:
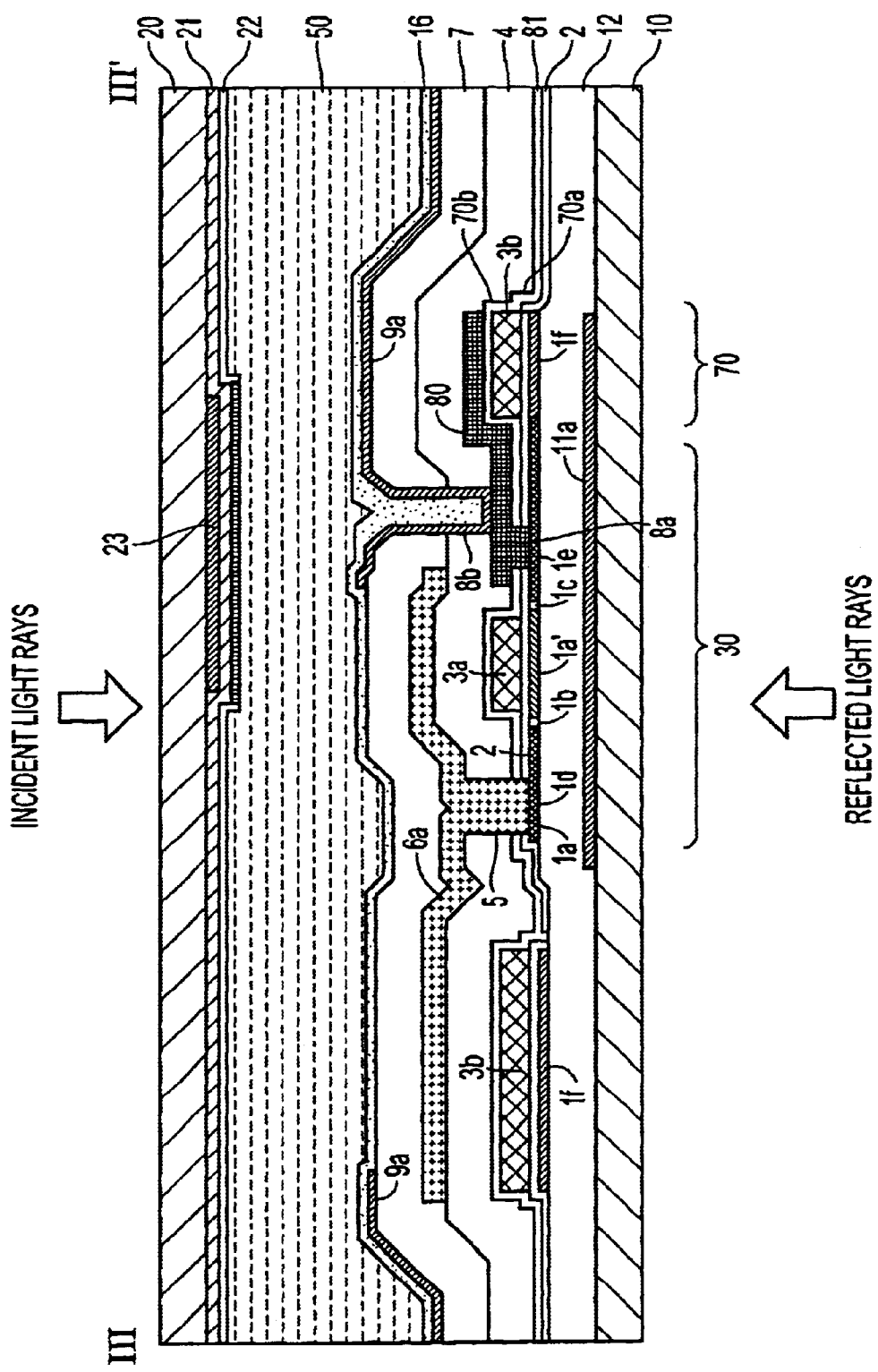
FIG. 3 is a sectional view taken along the line III—III of FIG. 2.

Referring now to FIG. 3 which is a sectional view of the liquid crystal device, the TFT array substrate 10 which by way of example constitutes one of the substrates is confronted by a counter substrate 20, which by way of example, serves as the other of the substrates. For instance, the TFT array substrate 10 may be a quartz substrate, a glass substrate, or a silicon substrate, whereas the counter electrode 20 may be a glass substrate or a quartz substrate. The TFT array substrate 10 carries the pixel electrodes 9a that are overlain by an alignment film 16 which has been subjected to a predetermined orientation or aligning treatment such as rubbing. The pixel electrode 9a is formed of, for example, a transparent conductive thin film such as ITO (Indium Tin Oxide). The alignment film 16 is formed of an organic thin film such as a polyimide thin film.

The counter electrode 21 is formed over the entire area of the counter substrate 20, and is underlain by an alignment film 22 that has been subjected to a predetermined orientation or aligning treatment such as rubbing. The counter electrode 21 is formed of, for example, a transparent conductive thin film such as ITO. The alignment film 22 is formed of an organic thin film such as a polyimide thin film.

The TFT array film 10 carries pixel switching TFTs 30, each of which is disposed at a position adjacent to the associated pixel electrode 9a, so as to effect a switching control of the pixel electrode 9a.

As will be seen from FIG. 3, the counter substrate 20 is provided with a second light-shielding film 23 at a position corresponding to the non-aperture region of each pixel. The second light-shielding film 23 prevents any light rays coming through the counter substrate 20 from impinging upon the channel region 1a', low-concentration source region 1b and the low-concentration drain region 1c of the semiconductor layer 1a. The second light-shielding film 23 also has functions such as enhancement of the contrast, prevention of mixing of colorants in a color filter, and so forth.

The space between the TFT array substrate 10 and the counter substrate 20, having the pixel electrodes 9a and the opposing counter electrode 21, is sealed by a later-mentioned sealant, and is charged with a liquid crystal which is one example of the electro-optical substance, whereby a liquid crystal layer 50 is formed. When no electrical field is applied from the pixel electrode 9a, the liquid crystal layer 50 is held in a predetermined state of orientation by the effect of the alignment films 16 and 22. By way of example, the liquid crystal layer 50 may be constituted by a nematic liquid crystal or mixture of more than one nematic liquid crystals. The sealant is an adhesive such as a photo-curable resin or a thermosetting resin, that can bond the TFT array substrate 10 and the counter substrate 20 at their boundaries. The sealant contains a spacing material such as glass fibers or glass beads that serves to maintain a predetermined distance between both substrates.

It is preferred that the aforementioned first light-shielding film 11a is provided between the TFT array substrate 10 and each pixel switching TFT 30, i.e., at each of the positions where the TFTs 30 oppose the substrate 10, as will be seen from FIG. 3. Preferably, the first light-shielding film 11a is made from a metal, an alloy or a metal silicide, containing at least one opaque, high-melt-point metals selected from the group consisting of Ti (titanium), Cr (chromium), W (wolfram), Ta (tantalum), Mo (molybdenum) and Pb (lead). The use of such a material prevents melting of the first light-shielding film 11a which otherwise be caused during high-temperature treatment in the process for forming the pixel switching TFT conducted subsequent to the formation of the first light-shielding film 11a on the TFT array substrate 10. The first light-shielding film 11a thus formed prevents the reflected light rays (returning light) from the TFT array substrate 10 from coming into the channel region 1a', low-concentration source region 1b and the low-concentration drain region 1c of the semiconductor layer 1a which constitutes the pixel switching TFT 30. This serves to eliminate undesirable change or deterioration of the characteristics of the pixel switching TFT 30 attributable to photo-excited current caused by any returning light.

The first light-shielding films 11a in the form of stripes may be laid under the scanning lines 3a and may also be electrically connected to a constant potential source or to a large-capacitance portion. Such an arrangement effectively prevents any potential fluctuation of the first light-shield film 11a from adversely affecting the pixel switching TFT opposed by the first light-shielding film 11a. Examples of the constant-potential source may be a negative or positive terminal of a constant voltage power supply such as the power supply for supplying power to the peripheral circuits for activating the liquid crystal device (e.g., a scanning line driver circuit, data line driver circuit, etc), a grounded terminal, or a constant-voltage power supply for supplying power to the counter electrode 21. The first light-shielding film 11a may be formed in a lattice to extend along the data lines 6a and the scanning lines 3a, or may be formed in the form of discrete islands so as to cover, at least, the channel region 1a', low-concentration source region 1b and the low-concentration drain region 1c of the pixel switching TFT 30.

An undercoating insulating film 12 is provided between the first light-shielding film 11a and a plurality of pixel switching TFTs 30. The undercoating insulating film 12 is provided for the purpose electrically isolating the semiconductor layer 1a constituting the pixel switching TFTs 30 from the first light-shielding film 11a The undercoating insulating film 12 may be formed over the entire area of the TFT array substrate 10, so as to serve as an undercoating film for the pixel switching TFTs 30. Namely, the undercoating insulating film 12 serves to prevent degradation of the characteristics of the pixel switching TFTs 30 which may be caused by roughening of the surface of the TFT substrate 10 after polishing or by presence of any residual contaminant after the rinsing of the same. The undercoating insulation film 12 may be formed from, for example, a highly insulative glass such as NSG (non-doped silicate glass), PSG (phosphor silicate glass), BSG (boron silicate glass), or BPSG (boron-phosphor silicate glass), a silicon oxide film, a silicon nitride film. The undercoating insulation film 12 also serves to prevent the first light-shielding film 11a from contaminating the pixel switching TFTs 30 and other elements.

In the illustrated embodiment, the semiconductor layer 1a is extended from the high-concentration drain region 1e to form a first storage capacitor electrode 1f which opposes a second storage capacitor electrode constituted by a portion of the capacitance line 3b opposing the first electrode 1f. At the same time, the insulating thin film 2 serving as a gate insulation film is extended from a portion thereof opposing the scanning line 3a so as to intervene between the first storage capacitor electrode 1f and the second storage capacitor electrode, thereby forming a first storage capacitor 70a, wherein the intervening portion of the insulating thin film 2 serves as a first dielectric film. At the same time, a portion of the barrier layer 80 opposing the second storage capacitor electrode is used as a third storage capacitor electrode, with a second dielectric film 81 intervening therebetween, whereby a second storage capacitor 70b is formed. The first and second storage capacitors thus formed are connected in parallel via the contact hole 8a, thus forming a storage capacitor 70. The insulating thin film 2, a portion of which serves as the first dielectric film of the first storage capacitor 70a, is nothing but the gate insulation film which serves for the TFT 30 and which is formed on the polysilicon film by oxidation at high temperature. This film therefore can be formed to have a small thickness and a high breakdown voltage. This enables the first storage capacitor 70a to have a large storage capacity with a comparatively small area The second dielectric film 81 also can be formed to have a small thickness which is the same as or smaller than that of the first dielectric film 2. The second storage capacitor 70b therefore can be formed to have a large storage capacitance with a comparatively small area, by making an effective use of the region between adjacent data lines 6, as shown in FIG. 2. Therefore, the storage capacitor 70, which is composed of the first and second storage capacitors 70a and 70b coupled three-dimensionally, can be implemented to have a large storage capacitance with a small area, by making an effective use of the region outside the aperture region of the pixel, i.e., by using a region under the data line 6a and the region where disclination tends to occur along the scanning line 3a (that is, the region where the capacitance line 3b is formed).

The second dielectric film 81 of the second storage capacitor 70b may be a film of a silicon oxide or a silicon nitride, or may be a laminate of a plurality of films. The second dielectric film 81 can be formed by any of known processes which are commonly used for forming insulating films, such as a vacuum CVD process, a plasma CVD process, a thermal oxidation process, a normal-pressure CVD process, sputtering, an ECR plasma process, or a remote plasma process. The diameter of the contact hole 8a may be further reduced when the second dielectric film 81 has a reduced thickness. This serves to reduce the sizes of the dents and steps that appear on the portion of the barrier layer 80 overlying the contact hole 8a, contributing to a further planarization of the pixel electrode 9 that overlies the barrier layer 80.

Referring to FIG. 3, the pixel switching TFT has an LDD (Lightly Doped Drain) structure, constituted by the scanning line 3a, the channel region 1a' of the semiconductor layer 1a which forms a channel under the electric field applied by the scanning line 3a, the insulating thin film 2 which isolates the scanning line 3a and the channel region 1a' from each other, the data line 6a, the low-concentration source region 1b and the low-concentration drain region 1c of the semiconductor layer 1a, and high-concentration source region 1d and high-concentration drain region 1e of the semiconductor layer 1a. One of the plurality of pixel electrodes 9a is connected to the high-concentration drain region 1e through the intermediary of the barrier layer 80. The low-concentration and high-concentration source regions 1b and 1d, and the low-concentration and high-concentration drain regions 1c and 1e are formed by doping the semiconductor layer 1a with impurities of predetermined concentrations for forming n or p-type channels, depending on whether channel to be formed is of n- or p-type, as will be explained later. An n-channel-type TFT advantageously exhibits a high speed of operation and, therefore, is commonly used as the pixel switching TFT. In this embodiment, the data line 6a formed of a low-resistance metallic film such as an Al (alumiunum) film or a thin film having high light-shielding effect and high conductivity such as an alloy film, e.g., a metal silicide film. The barrier layer 80 and the second dielectric film 81 are overlain by a first inter-layer insulating film 4 formed thereon, in which are formed the contact hole 5 leading to the high-concentration source region 1d and the contact hole 8b leading to the barrier layer 80. The data line 6a is electrically connected to the high-concentration source region 1d via the contact hole 5, which leads to the high-concentration source region 1d. A second inter-layer insulating film 7 is formed on the data line 6a and the first inter-layer insulating film 4. The contact hole 8b leading to the barrier layer 80 penetrates this second inter-layer insulating film 7. The pixel electrode 9a is electrically connected to the barrier layer 80 via the contact hole 8b and further to the high-concentration drain region 1e through the intermediary of the barrier layer 80, and then through the contact hole 8a. The aforementioned pixel electrode 9a is formed on the upper surface of the second inter-layer insulating film 7 having the described construction.

The pixel switching TFT 30 preferably has an LDD structure as described. The pixel switching TFT 30, however, may have an offset structure which is obtained by omitting injection of impurity ions to the low-concentration source region 1b and the low-concentration drain region 1c, or may be a self-aligning TFT which is produced by implanting impurity ions at high concentration by using, as a mask, the gate electrode constituted by a portion of the scanning line so as to form high-concentration source and drain regions 1d and 1e in a self-aligning manner.

The described embodiment employs a single-gate structure in which only one gate electrode constituted by a portion of the scanning line 3a of the pixel switching TFT intervenes between the high-concentration source region 1d and the high-concentration drain region 1e. This, however, is only illustrative and the invention does not exclude the use of two or more gate electrodes arranged between these high-concentration source and drain regions 1d and 1e. In such a case, all of the gate electrodes are supplied with the same signal. A TFT having such a dual gate structure, triple gate structure or a structure having more gates effectively prevents leakage of electrical current at the junctures between the channel and the source-drain regions, thus contributing to a reduction in the electric current flowing during off period of the TFT. A further reduction of the off-current is possible by forming at least one of the gate electrodes to have an LDD structure of offset structure, thus implementing a stable switching element.

As will be seen from FIGS. 2 and 3, in the liquid crystal device of the described embodiment, the high-concentration drain region 1e and the pixel electrode 9a are electrically connected via the contact holes 8a and 8b, through the intermediary of the barrier layer 80. It will be appreciated that each of the contact holes 8a and 8b can have a diameter smaller than that of a single, continuous, long contact hole which is used in conventional devices to provide electrical connection between the pixel electrode 9a and the drain region. More specifically, formation of a single, continuous, long contact hole encounters a problem that the etching precision is impaired when the depth of the contact hole increases. In order to prevent penetration of the semiconductor layer 1a which is as thin as 50 nm or so, it is necessary to set up the etching process such that dry etching which enables formation of a contact hole of a small diameter be stopped midway the etching process and be substituted by wet etching which progressively proceeds to reach the semiconductor layer. Alternatively, an additional polysilicon film is provided for the purpose of preventing the semiconductor layer 1a from being penetrated by the dry etching.

In contrast, in this embodiment, the electrical connection between the pixel electrode 9a and the high-concentration drain region 1e is achieved by a pair of contact holes 8a and 8b that are arranged to provide a series connection. Each of these contact holes 8a and 8b can fully be formed by dry etching or, if not, the distance or the hole depth which has to be processed by wet etching can be minimized. The invention, however, does not exclude wet etching which is intentionally executed for a comparatively short period of time subsequent to the dry etching, for the purpose of imparting a slight taper to each of the contact holes 8a and 8b.

It will be understood that the present invention makes it possible to reduce the diameter of each of the contact holes 8a and 8b. This correspondingly reduces dimensions of dents and steps which appear on the surface of the barrier layer 80 at the location right above the contact hole. This contributes to planarization of the corresponding portion of the overlying pixel electrode 9a to some extent. Further, the dents and steps appearing on the surface of the pixel electrode 9a at the location right above the second contact hole 8b can also be reduced, contributing to the planarization of the surface of the pixel electrode 9a to some extent.

In this embodiment, the barrier layer 80 in particular is made of a light-shielding, electrically conductive film. It is therefore possible to define, by using the barrier layer 80, the aperture region of each pixel at least partially. For instance, the barrier layer 80 is made of a metal, alloy or a metal silicide containing at least one of opaque, high-melt-point metal selected from Ti, Cr, W, Ta, Mo and Pb, as in the case of the first light-shielding film 11a. The electrical resistance at the connection between such a high-melt-point metal and the ITO film constituting the pixel electrode 9a is small, so that excellent electrical connection is achieved between the barrier layer 80 and the pixel electrode 9*a* via the contact hole 8*b*. The thickness of the barrier layer 80 is preferably not smaller than 50 nm but not greater than 500 nm. A film thickness of 50 nm or greater significantly reduces the risk of penetration during the formation of the second contact hole 8*b*, while a film thickness of 500 nm or so causes the steps on the surface of the pixel electrode 9*a* due to the presence of the barrier layer 80 to be reduced to a negligibly small level or, if not, allows such steps to be removed by planarization comparatively easily. It is possible to define the aperture region of each pixel by a combination of opaque elements such as a combination of the data line 6*a*, barrier layer 80 and the first light-shielding film 11*a*, or a combination of the data line 6*a* and the barrier layer 80. This eliminates the necessity for the formation of the second light-shielding film 23 on the counter substrate 20, thus contributing to the reduction in the number of steps of the production process. This also serves to prevent reduction in the aperture ratio or fluctuation of the same attributable to misalignment of the counter substrate 20 with respect to the TFT array substrate. Conventionally, the second light-shielding film 23 on the counter substrate 20 is formed to have a size greater than that actually needed, in order to accommodate any misalignment between the counter substrate 20 and the TFT array substrate 10. In this embodiment, however, the aperture region of the pixel can be precisely defined by the light-shielding films provided on the TFT array substrate 10, such as the data line 6*a*, barrier layer 80, and so forth. It is therefore possible to increase the aperture ratio of the pixel as compared with the case where the aperture region is defined by the second light-shielding film 23 that is provided on the counter substrate 20.

The described embodiment offers various advantages brought about by the electrically conductive and opaque nature of the barrier layer 80. It is not essential that the barrier layer 80 be formed of a metal having a high melting point. For instance, the barrier layer 80 may be formed of a low-resistance, i.e., conductive, polysilicon film doped with, for example, phosphor. The barrier layer 80 when made from such a polysilicon film does not have light-shielding effect but satisfactorily performs the intended function of the barrier layer 80, i.e., to serve as an intermediary for the electrical connection, as well as a function for enhancing the storage capacity of the storage capacitor 70. Further, the barrier layer 80 made of polysilicon reduces the thermal and other stresses occurring between the barrier layer 80 and the first inter-layer insulating film 4, which effectively suppresses cracking of the barrier layer 80 and other elements around the barrier layer 80. The barrier layer 80 also may have a laminate structure composed of a polysilicon film and a metal film formed thereon, or a pair of polysilicon films sandwiching therebetween a metal film. The barrier layer 80 when formed of a polysilicon film remarkably reduces the contact resistance developed at the connection between the barrier layer 80 and the high-concentration drain region 1*e* which also is made of polysilicon. When the polysilicon barrier layer 80 having no light-shielding effect is used, the shielding of the light for defining the aperture region of the pixel may separately be performed using the first light-shielding film 11*a* and the second light-shielding film 23.

In the described embodiment, the contact hole 8*b* is formed in the non-aperture region, in symmetry with respect to two adjacent data lines 6*a* In other words, the contact hole 8*b* is formed at a position substantially amidst between two adjacent data lines 6*a* when viewed in plan. The contact hole 8*b*, which reaches the pixel electrode 9*a*, more or less produces dents or steps appearing in the surface of the pixel electrode 9*a*. When the alignment film 16 formed on the pixel electrode 9*a* is subjected to an aligning treatment such as rubbing, disclination of the liquid crystal tends to occur in the region right above these dents and steps. In the illustrated embodiment, the contact hole 8*b* is formed in symmetry with respect to two adjacent data lines 6*a*. Therefore, the dents and steps on the surface of the pixel electrode 9*a* due to the presence of the contact hole 8*b* appear in a symmetrical manner with respect to these two data lines 6*a*. This means that, when the rubbing treatment is effected on the alignment film 16, the disclination attributable to the presence of the dents and steps on the surface of the pixel electrode 9*a* occurs in the same fashion on all the pixels, regardless of whether the TN liquid crystal is of the type which twists clockwise or counterclockwise as viewed from the counter substrate 20*a*. This serves to avoid multiplication of defect due to superposition of defective parts of pixels in a multi-plate color projector composed of a plurality of liquid crystal devices having different directions of distinct vision and a counterclockwise-shift liquid crystal device.

Furthermore, in the described embodiment, the contact hole 8*a* also is formed in the non-aperture region in symmetric with respect to two adjacent data lines 6*a*. The contact hole 8*a* is comparatively spaced apart from the pixel electrode 9*a*, because of the presence of intervening layers such as the inter-layer insulating films. The influence on the state of the surface of the pixel electrode 9*a* caused by the contact hole 8*a*, therefore, is not so strict as that caused by the contact hole 8*b*. In addition, as in the case of the dents and steps caused by the presence of the contact hole 8*b*, the dents and steps caused on each pixel by the presence of the contact hole 8*a* can appear evenly along the scanning line.

Further, the barrier layer 80 also is arranged to have a planar shape which is substantially symmetric with respect to two adjacent data lines within the non-aperture region. Therefore, any step on the surface of the pixel electrode 9*a* due to the thickness of the barrier layer 80 appears in a manner symmetrical with respect to the two adjacent. Therefore, a rubbing treatment does not cause any asymmetry of undesirable effect in each of the pixels, regardless of the direction of the rubbing. Each barrier layer 80 is formed in an island associated with its own pixel, so that the liquid crystal device is freed from any influence of stress in the barrier layer 80.

As will be seen from FIG. 2, the scanning line 3*a* and the capacitance line 3*b* extend in a pair substantially in a side-by-side relation, within a portion of the non-aperture region which extends in the direction of the scanning line 3*b*. The contact hole 8*a* is formed in the portion of the non-aperture region which extends in the direction of the scanning line 3*b*, at a position between the scanning line 3*a* and the capacitance line 3*b*. This eliminates the risk of short-circuiting between the lines such as the scanning line 3*a* and the capacitance line 3*b* and the high-concentration drain region 1*e*. It is also to be noted that, although the influence of the contact hole 8*a* is transmitted through the layers such as the first and second inter-layer insulating films 4 and 8 so as to appear as dents and steps on the surface of the pixel electrode 9*a*, such dents and steps are concentrated to a central portion of the non-aperture region, i.e., to a portion between the scanning line 3*a* and the capacitance line 3*b*. Consequently, the dents and steps of the surface of the pixel electrode 9*a* attributable to the presence of the contact hole 8*a* can be retracted apart from the aperture region of the pixel into the non-aperture region, by a distance corresponding to the widths of the scanning line 3*a* and the capacitance line 3b. Consequently, the dents and steps caused by the presence of the contact hole 8a can hardly affect the aperture region, even when no planarization treatment is effected on the intervening layers such as the first and second inter-layer insulating films 4 and 7. As shown in FIG. 2, in order to avoid any narrowing of the scanning line 3a and the capacitance line 3b or any unnecessary widening of the non-aperture region attributable to the presence of the contact hole 8a, the capacitance line 3b has such a planar shape as to be contracted at portions corresponding to the contact holes 8a and 8b. This arrangement effectively prevents reduction in the aperture ratio of the pixel. Likewise, the scanning line 3a also may have a planar shape which is contracted at portions corresponding to the contact holes 8a and 8b are formed. In the case where the barrier layer 80 is formed on the capacitance line 3b with the second dielectric film 81 intervening therebetween, the contact hole 8b may be formed above the capacitance line 3b. This arrangement advantageously provides an additional storage capacitance in the region where the contact hole 8b is formed.

The barrier layer 80 is formed at a level below the Al layer which constitutes the data line 6a. Therefore, the contact hole 8b may be located anywhere in the planar region, except for the region where the data line 6a exists.

Further, the contact hole 8b when viewed in plan is positioned within the portion of the non-aperture region which extends along the scanning line 3a, at a position substantially amidst the width of this portion of the non-aperture region, the width in this case means the dimension as measured in the direction in which the data line 6a extends. Consequently, the dents and steps appearing on the surface of the pixel electrode 9a due to the presence of the contact hole 8b can be concentrated substantially to the widthwise mid part of the portion of the non-aperture region that extends along the scanning line 3a, when viewed in plan. Therefore, any undesirable effect of the dents and steps caused by the presence of the contact hole 8b is less likely to reach the aperture region.

Each of the contact holes 8a and 8b, as well as the contact hole 5, may have any suitable planar shape or cross-section such as circular, square or other polygonal shape, among which circular shape is effective in minimizing cracking of portions of the layers such as inter-layer insulating films around the contact hole. Preferably, the contact hole is formed by a process in which dry etching is executed first followed by wet etching which is intended to impart a slight taper to the contact hole.

As will be understood from the foregoing description, according to the present invention, the positions of the contact hole 8a and the contact hole 8b are exquisitely determined such that all the pixels stably exhibit the same tendency of occurrence of defect attributable to the dents and steps on the surface of the pixel electrode 9a caused by the presence of the contact hole 8b. It is therefore possible to effectively avoid inconveniences such as degradation of the quality of the displayed image and production of unacceptably defective products, which otherwise be caused by eventual enhancement of defect to a noticeable level at local portions of the image display area. In addition, the contact hole 8b may be located at any suitable position within the area of the barrier layer 80 except for the region where the data line 6a exists. This serves to remarkably enhance the degree of freedom in the selection of the position of the contact hole 8b and, hence, the degree of freedom in the design of the planar layout, thus offering a great practical advantage.

Process of Producing First Embodiment of the Electro-optical Device

A description will now be given of a process for producing the liquid crystal device of the embodiment having the described structural features, with reference to FIGS. 4 to 7. In FIGS. 4 to 7, the layers on the TFT array substrates are shown at different steps of the process, in sectional views similar to that shown in FIG. 3, i.e., in a sectional view taken along the line III—III of FIG. 2.

Figure 4:
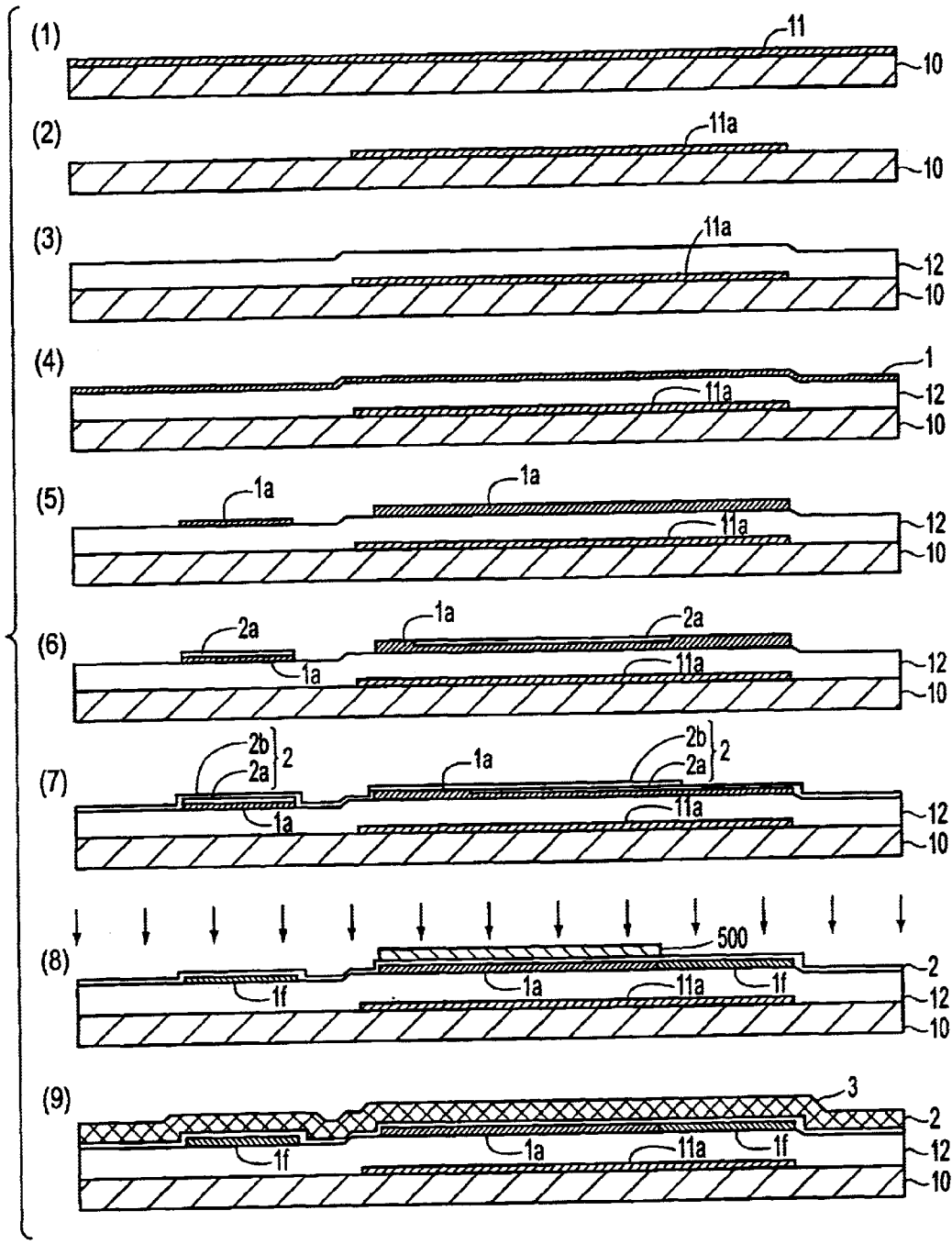
FIG. 4 is a flowchart illustrative of a process for producing the liquid crystal device of the first embodiment (part 1).

Referring first to FIG. 4, in particular Step (1), a TFT array substrate is prepared from, for example, quartz glass, hard glass or silicon. Preferably, the TFT array substrate is heat-treated at a high temperature of about 900° C. to about 1300° C. in an inert gas atmosphere such as of $N_2$ (nitrogen). This pre-treatment reduces any distortion or strain of the TFT array substrate 10 which may be caused in subsequent high-temperature process. More specifically, the pretreatment is conducted by heating the TFT array substrate to a temperature equal to or higher than the highest temperature which the TFT array substrate 10 must undergo in the production process. A film of a metal such as of Ti, Cr, W, Ta, Mo or Pb, or of an alloy such as a metal silicide is formed by, for example, sputtering, over the entire area of the TFT array substrate 10 which has been pre-treated as described above, so that a light-shielding film 11 of a thickness ranging from 100 to 500 nm, preferably about 200 nm, is obtained. In order to reduce reflection from the surface of this light-shielding film 1, an anti-reflection film such as of polysilicon may be formed on this light-shielding film 11.

Then, in Step (2), a resist mask of a shape corresponding to the pattern of the first light-shielding film 11a (see FIG. 2) is formed on the light-shielding film 11 by photolithographic technique, and etching is conducted on the light-shielding film 11 across the resist mask, whereby the first light-shielding film 11a is formed.

In the next step, in Step (3), an undercoating insulating film 12 is formed on the first light-shielding film 11a. More specifically, a CVD process is executed under normal pressure or under a reduced pressure, using a gas such as TEOS (tetraethyl ortho silicate) gas, TEB (tetraethyl boatrate) gas or TMOP (tetramethyl oxy phosrate) gas, whereby the undercoating film 12 of a silicate glass such as NSG, PSG, BSG or BPSG, silicon nitride or silicon oxide is formed. The thickness of the undercoating insulating film 12 ranges, for example, from about 500 nm to about 2000 nm. The first light-shielding film 11a and the undercoating insulating film 12 may be omitted, if the light returning by reflection from the reverse side of the TFT array substrate does not matter.

Then, in Step (4), a CVD process under a reduced pressure (e.g., about 20 Pa to about 40 Pa) is conducted by using monosilane gas or disilane gas at a rate of about 400 cc/min to about 600 cc/min, within an atmosphere of a comparatively low temperature ranging from about 450° C. to about 550° C., preferably about 500° C., whereby an amorphous silicon film is formed on the undercoating insulating film 12. Then, a heat treatment is conducted for about 1 to 10 hours, preferably for about 4 to 6 hours, at about 600° C. to about 700° C., within a nitrogen atmosphere, whereby a polysilicon film 1 makes a solid-phase growth to a thickness of from about 50 nm to about 200 nm, preferably about 100 nm. Such a solid-phase growth may be effected by a heat treatment which uses RTA (Rapid Thermal Anneal) technique, or by a laser heat-treatment which uses excimer laser.

When the pixel switching TFT 30 shown in FIG. 3 is intended to be of n-channel type, the channel region may be slightly doped by, for example, ion injection, with impurities of a group-V element such as Sb (antimony), As (arsenic) or P (phosphor). Conversely, if the pixel switching TFT 30 is intended to be of p-channel type, the channel region may be slightly doped by, for example, ion injection, with impurities of a group-III element such as B (boron), Ga (garium) or In (Indium). The polysilicon film 1 may be formed directly by, for example, a vacuum CVD technique, skipping over the step of forming the amorphous silicon film. Alternatively, the polysilicon film 1 may be formed by implanting silicon ions into a polysilicon film deposited by, for example, vacuum CVD, thereby tentatively obtaining an amorphous phase, followed by re-crystallization implemented by, for example, a heat treatment.

Referring now to Step (5), the semiconductor layer 1$a$ having a predetermined pattern such as that shown in FIG. 2 is formed by, for example, a photo-lithographic technique or an etching.

Then, in Step (6), the semiconductor layer 1$a$ for constituting the pixel switching TFT 30 is thermally oxidized by being heated at a temperature of from about 900° C. to about 1300° C., preferably at about 1000° C., whereby a thermal-oxidation silicon film 2$a$ having a comparatively small thickness of about 30 nm is formed. Subsequently, Step (7), an insulating film 2$b$ of high-temperature-oxidized silicon (HTO) or silicon nitride is deposited to a comparatively small thickness of about 50 nm, thereby forming a first dielectric film for forming a storage capacitor, along with the insulating film 2 of the pixel switching TFT 30 having a multi-layered structure including the thermal-oxidation silicon film 2$a$ and the insulating film 2$b$. As a result, the thickness of the semiconductor layer 1$a$ ranges from about 30 nm to about 150 nm, preferably from about 35 nm to about 50 nm, while the thickness of the insulating film 2 (first dielectric film) has a thickness of from about 20 nm to about 150 nm, preferably from about 30 nm to about 100 nm. By shortening the period of the oxidation at high temperatures as described, it is possible to avoid undesirable warp of the substrate, even when the substrate has a size as large as 8 inches. The process, however, may be modified such that a single-layered insulating film 2 is formed by subjecting the polysilicon film 1 only to a thermal oxidation.

Subsequently, in Step (8), a resist layer 500 is formed by a photo-lithographic technique or an etching, on the semiconductor layer 1$a$, except for the region which is intended to form the first storage capacitor electrode 1$f$. Then, the semiconductor layer 1$a$ is doped across the resist layer 500 with, for example, P ions at a dosage of $3 \times 10^{12}/cm^2$, whereby the resistance of the region which is bound to form the first storage capacitor electrode 1$f$ is reduced.

Then, in Step (9), a polysilicon film 3 is deposited by, for example, a vacuum CVD process, after removal of the resist layer 500. A subsequent thermal diffusion of P causes the polysilicon film 3 to become conductive. Alternatively, a low-resistance polysilicon film is formed by introducing P ions simultaneously with the deposition of the polysilicon film 3. The polysilicon film is deposited to a thickness of from about 100 nm to about 500 nm, preferably about 300 nm.

Figure 5:
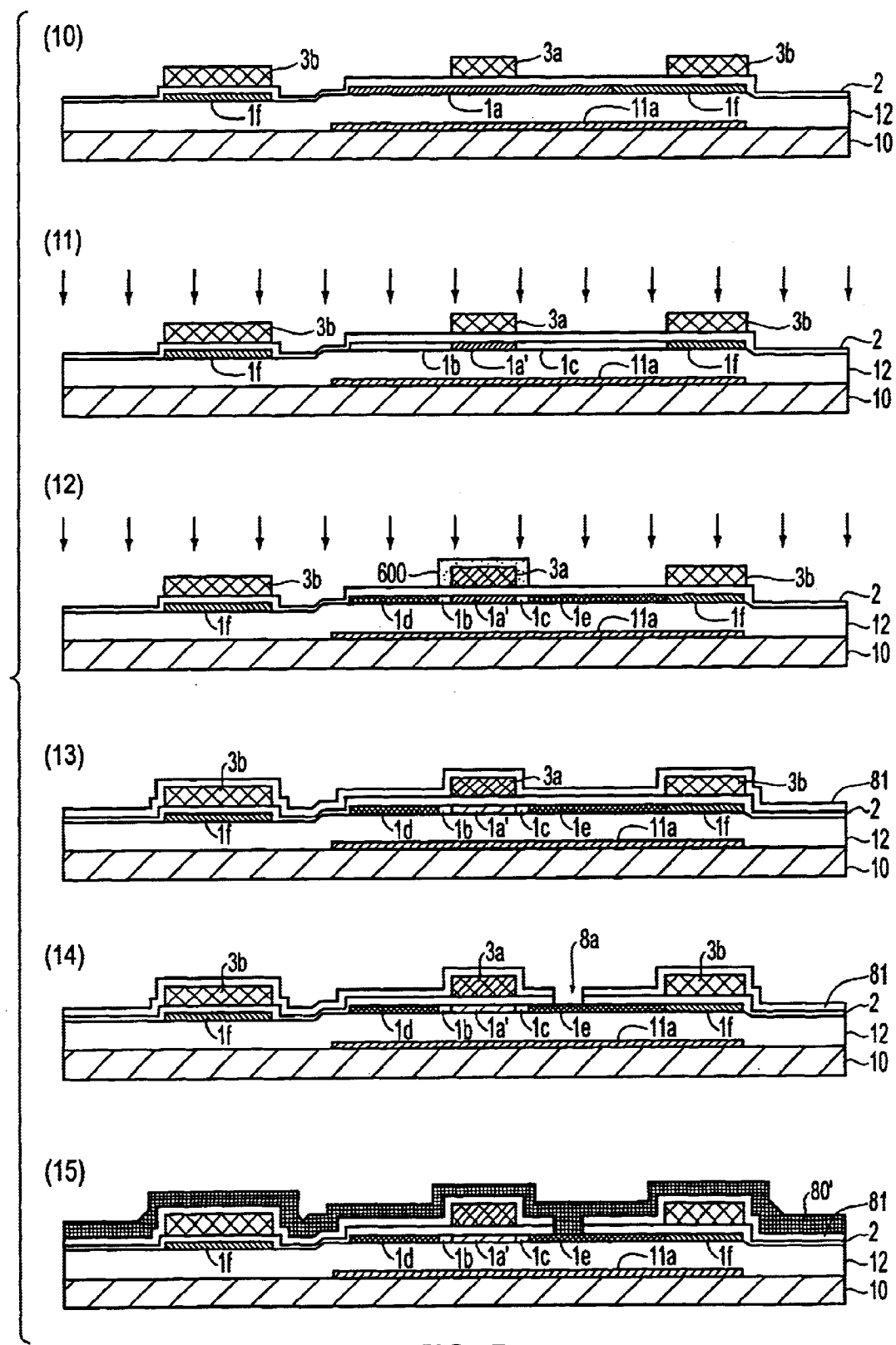
FIG. 5 is a flowchart illustrative of a process for producing the liquid crystal device of the first embodiment (part 2).

Then, in Step (10), shown in FIG. 5 scanning lines 3$a$ of a predetermined pattern as shown in FIG. 2 are formed along with the capacitance lines 3$b$, by a photo-lithographic process or etching conducted by using a resist mask. The scanning lines 3$a$ and the capacitance lines 3$b$ may be formed from a metal having a high melting point or an alloy such as a metal silicide, or may be formed as multi-layered wiring by being combined with, for example, a polysilicon film.

Referring to Step (11), when the pixel switching TFT 30 shown in FIG. 3 is to be formed as an n-channel-type TFT having an LDD structure, the low-concentration source region 1$b$ and the low-concentration drain region 1$c$ are formed on the semiconductor layer 1$a$. To this end, the semiconductor layer 1$a$ is doped with impurity ions of a group-V element such as P. The doping is conducted while using as a mask the portion of the scanning line 3$a$ constituting the gate electrode, with P ions at a dosage of from $1 \times 10^{13}/cm^2$ to $3 \times 10^{13}/cm^2$. Consequently, the portion of the semiconductor layer 1$a$ under the scanning line 3$a$ is changed into a channel region 1$a'$.

Then, in Step (12), the high-concentration source region 1$d$ and the high-concentration source region 1$e$ of the pixel switching TFT 30 are formed. This is done by forming a resist layer 600 of a width greater than that of the scanning line 3$a$, such that the resist layer 600 overlies the scanning line 3$a$, and a doping is performed with impurity of a group-V element such as P at a high concentration, e.g., at a dosage of from $1 \times 10^{15}/cm^2$ to $3 \times 10^{15}/cm^2$. In contrast, when the pixel switching TFT 30 is to be formed as a p-channel-type TFT, doping is effected on the semiconductor layer 1$a$ with impurity of a group III element such as B, thereby forming the low-concentration source region 1$b$, low-concentration drain region 1$c$, high-concentration source region 1$d$ and the high-concentration drain region 1$e$. This, however, is not exclusive and the process may be modified such that the doping at low concentration is omitted, so that a TFT having an offset structure is obtained. It is also possible to obtain a self-aligned-type TFT by ion injection with P ions or B ions, using the scanning line 3$a$ as a mask.

The process may be such that peripheral circuits such as data-line driver circuit and scanning-line driver circuit, each having a complementary structure composed of an n-channel TFT and a p-channel TFT, are formed on the peripheral regions of the TFT array substrate, simultaneously with the formation of the pixel switching TFT 30. Thus, in the described embodiment, use of a polysilicon film as the semiconductor layer 1$a$ of the pixel switching TFT 30 makes it possible to form the peripheral circuits in the same step as that for forming the pixel switching TFT 30, thus offering an advantage from the viewpoint of production.

Subsequently, as shown in Step (13), after removal of the resist layer 600, the second dielectric film 81 of a high-temperature-oxidized silicon (HTO) or silicon nitride is deposited on the capacitance lines 3$b$ and the scanning lines 3$a$ and also on the insulating thin film (first dielectric film) 2 to a comparatively small thickness of not greater than about 200 nm, by a vacuum CVD process or a plasma CVD process. It is to be understood, however, that the second dielectric film 81 may be constituted by a multi-layered film, as described before, and can be formed by any of techniques which are commonly used for deposition of insulating films of TFTs. In case of the first inter-layer insulating film 4, too small of a thickness undesirably increases the parasitic capacitance between the data line 6$a$ and the scanning line 3$a$. This, however, is not the case of the second dielectric film 81. In case of the insulating film 2 of the TFT 30, too small of a thickness may cause unique phenomenon such as a tunneling effect to occur. This also does not apply to the case of the second dielectric film 81. Further, the second dielectric film 81 serves as a dielectric film between a second storage capacitor electrode constituted by a part of the capacitance line and a third storage capacitor electrode which is constituted by a part of the barrier layer 80. Thus, the capacitance of the second storage capacitor 70$b$ increases in accordance with decrease in the thickness of the second dielectric film 81. For these reasons, the second dielectric film 81 is formed as an insulating film having an extremely small thickness, e.g., 50 nm or less, smaller than that of the insulating film 2, thus enhancing the advantages produced by this embodiment.

Then, in Step (14), the contact hole 8a for achieving electrical connection between the barrier layer 80 and the high-concentration drain region 1e is formed by a dry etching process such as reactive ion etching or reactive ion beam etching. Such a dry etching technique offers high directivity and, hence, can form the contact hole 8a having a small diameter. Alternatively, wet etching may be used in combination with the dry etching, in order to prevent the contact hole 8a from penetrating the semiconductor layer 1a. Such a wet etching is also effective to impart a taper to the contact hole 8a, thus realizing better electrical connection.

Then, in Step (15), a conductive film 80' of a thickness ranging from 50 to 500 nm is formed over the entire part of the high-concentration drain region 1e which is exposed through the second dielectric film 81 and the contact hole 8a by, for example, sputtering with a metal such as Ti, Cr, W, Ta, Mo or Pb, or an alloy such as a metal silicide. The risk of penetration by the contact hole 8(b) which will be formed later is almost nullified when this film has a thickness of 50 nm at the smallest. An anti-reflection film such as a polysilicon film may be formed on the conductive film 81'. In order to obtain a stress relieving effect, the conductive film 80' may be formed of a polysilicon. In such a case, the conductive film 80' may have a multi-layered structure having two or more layers, including an underlying conductive silicon film and an overlying metal film. Use of polysilicon as the material of the conductive film 80' remarkably reduces the contact resistance at the contact between the conductive film 81' and the high-concentration drain region 1e which also is formed of polysilicon.

Figure 6:
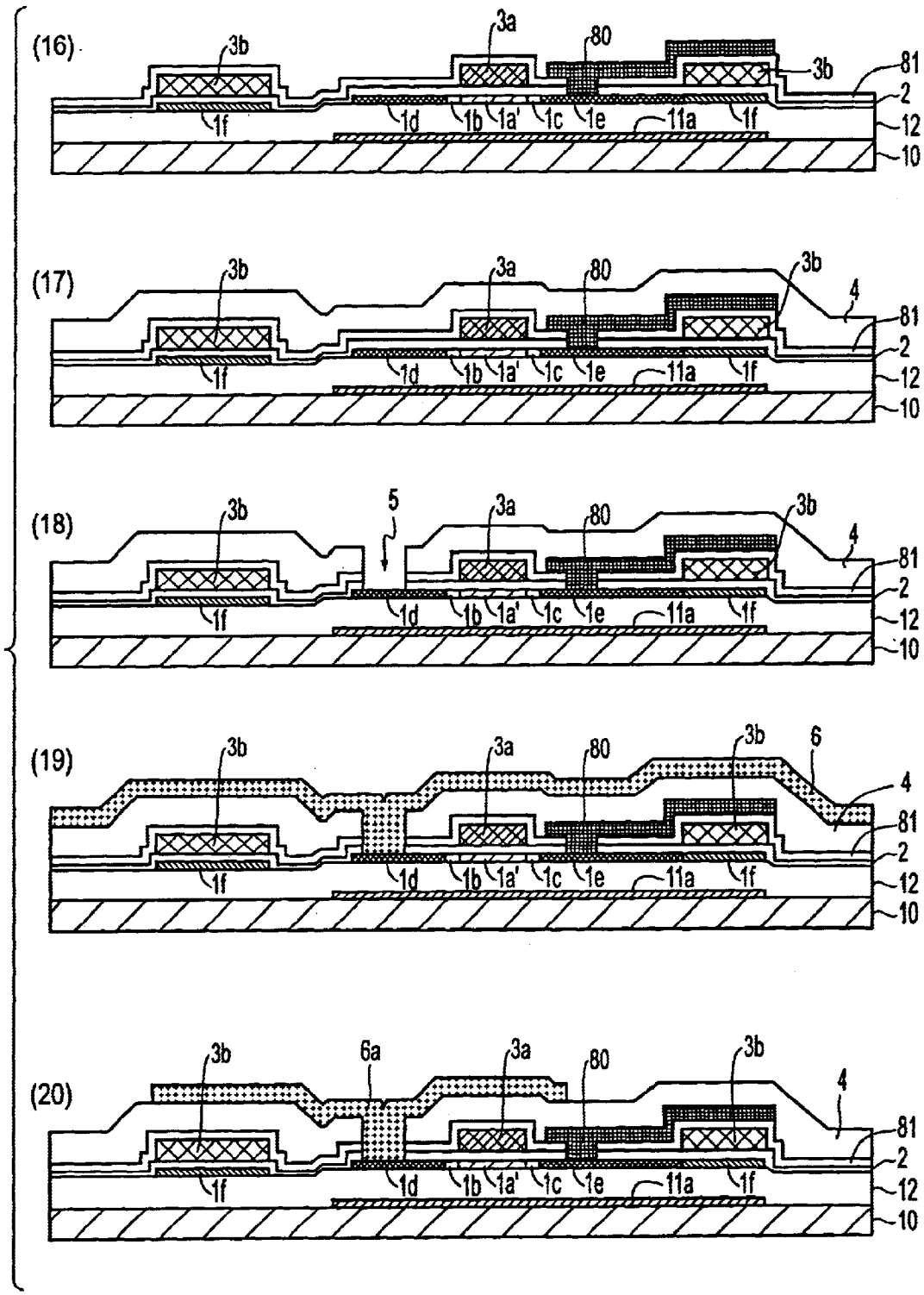
FIG. 6 is a flowchart illustrative of a process for producing the liquid crystal device of the first embodiment (part 3).

Subsequently, in Step (16) shown in FIG. 6, a resist mask corresponding to the pattern of the barrier layer 80 (see FIG. 2) is formed on the conductive film 81' by a photolithographic technique, and etching is conducted on the conductive film 81' through this resist mask, whereby the barrier layer 80 is formed having the third storage capacitor electrode.

Then, in Step (17), a normal-pressure CVD process or a vacuum CVD process is executed by using, for example, a TEOS gas, whereby the first inter-layer insulating film 4 of a silicate glass, e.g., NSG, PSG, BSG or BPSG, silicon nitride or silicon oxide is formed so as to cover the second dielectric film 81 and the barrier layer 80. Preferably, the thickness of the first inter-layer insulating film ranges from about 500 nm to about 1500 nm. Thickness of the first inter-layer insulating film 4 not smaller than 500 nm will substantially eliminate any problem caused by a parasitic capacitance formed between the data line 6a and the scanning line 3a.

Then, in Step (18), a heat treatment is conducted at about 1000° C. for 20 minutes, in order to activate the high-concentration source region 1d and the high-concentration drain region 1e, followed by perforation of the contact hole 5 for the data line 6a. Other contact holes which are intended to provide electrical connections of the scanning lines 3a and capacitance lines 3b to other circuits in the peripheral regions of the TFT array substrate 10 may be formed in the first inter-layer insulating film 4, in the same step as that for forming the contact hole 5.

Subsequently, in Step (19), a light-shielding metallic film 6 of a low-melt-point metal such as Al or a metal silicide is formed by sputtering on the first inter-layer insulating film 4 to a thickness of from about 100 nm to about 500 nm, preferably about 300 nm.

Then, the data lines 6a are formed by a photolithographic technique or an etching, as in Step (20).

Figure 7:
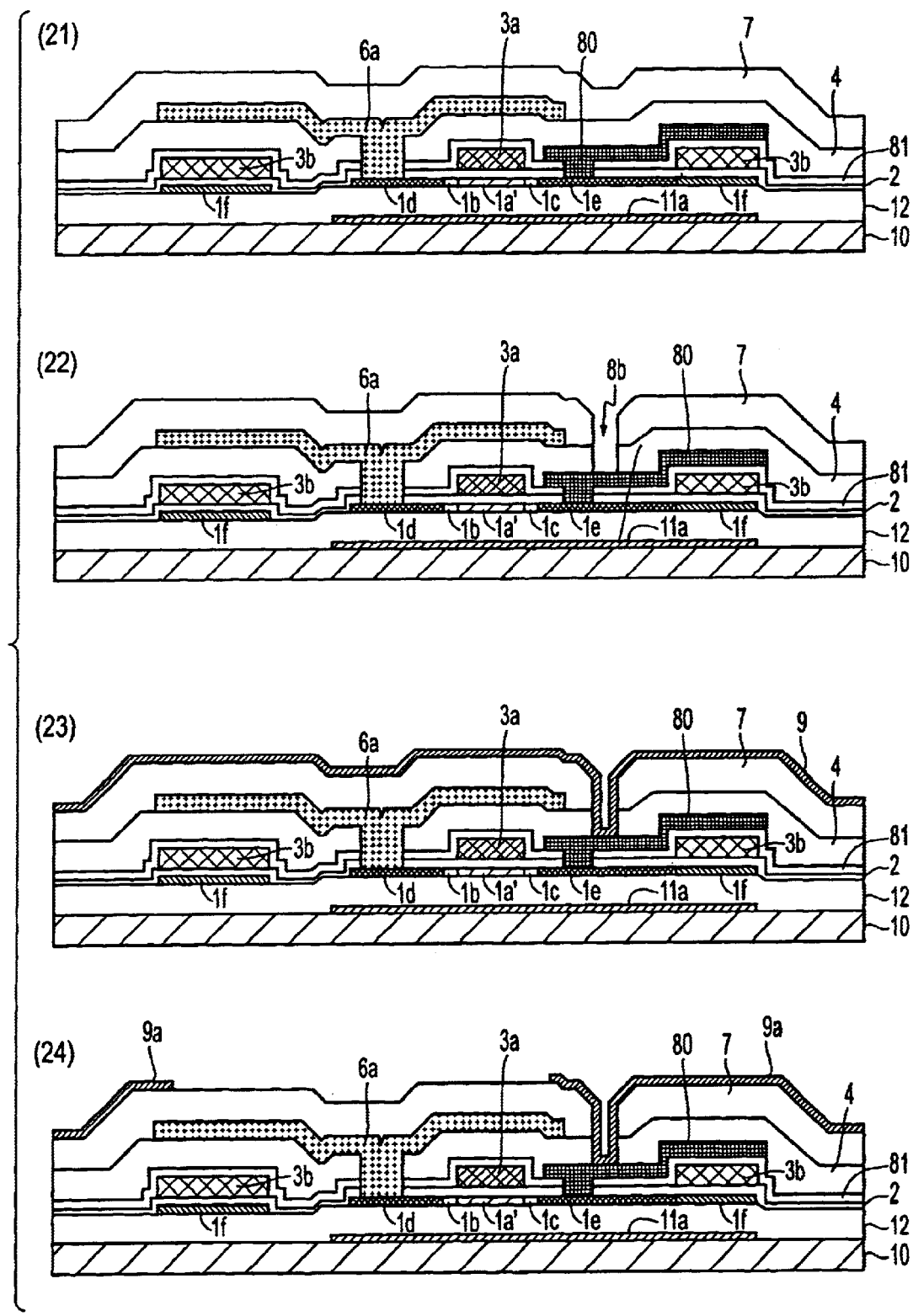
FIG. 7 is a flowchart illustrative of a process for producing the liquid crystal device of the first embodiment (part 4).

Referring now to FIG. 7, in Step (21), a normal-pressure CVD process or a vacuum CVD process is executed while using, for example, a TEOS gas, whereby the second inter-layer insulating film 7 of a silicate glass, e.g., NSG, PSG, BSG or BPSG, silicon nitride, silicon oxide or the like is formed so as to cover the data lines 6a Preferably, the thickness of the second inter-layer insulating film 7 ranges from about 500 nm to about 1500 nm.

Then, in Step (22), the contact hole 8b for providing electrical connection between the pixel electrode 9a and the barrier layer 80 is formed by dry etching, such as reactive ion etching or reactive ion beam etching. In order to impart taper to the contact hole 8b, wet etching may be used.

Then, in Step (23), a transparent conductive film 9 such as an ITO film is deposited on the second inter-layer insulating film 7 to a thickness of from about 50 nm to about 200 nm, followed by formation of the pixel electrodes 9a by a photolithographic technique or etching, as in Step (24). When the liquid crystal device to be obtained is a reflection-type device, the pixel electrodes 9a may be formed from an opaque material having high reflectivity, such as an Al film.

Subsequently, a polyimide-type coating solution as the material of the alignment film is applied to the pixel electrodes 9a, and a rubbing treatment is effected in a predetermined direction so as to provide a predetermined pre-tilt angle, whereby the alignment film 16 (see FIG. 3) is obtained.

Meanwhile, the counter substrate 20 as shown in FIG. 3 is prepared as follows. A substrate such as a glass substrate is prepared. Then, a sputtering is effected to deposit, for example, metallic chromium, followed by a photolithographic process and an etching process, whereby the second light-shielding film 23 and a third light-shielding film are formed. The third light-shielding film serves as a later-mentioned framework. The second and third light-shielding films may be formed from a metal such as Cr, Ni, Al or the like, as well as form a material such as a resin black which is obtained by dispersing carbon or Ti in a photo-resist. The second light-shielding film 23 and the third light-shielding film on the counter substrate 20 may be omitted, provided that the light-shielding region can be defined by the data line 6a, barrier layer 80, first light-shielding film 11a and so forth which are formed on the TFT array substrate 10.

Then, a transparent conductive thin film such as of ITO is deposited by sputtering over the entire area of the counter substrate 20 to a thickness of from about 50 nm to about 200 nm, thereby forming the counter electrode 21. Then, a polyimide-type coating solution as the material of the alignment film is applied to the entire surface of the counter electrode 21, and a rubbing treatment is performed in a predetermined rubbing direction so as to impart a predetermined pre-tilt angle, whereby the alignment film 22 (see FIG. 3) is obtained.

The TFT array substrate 10 and the counter substrate 20 thus prepared are bonded together by a later-mentioned sealant, such that their alignment films 16 and 22 oppose each other, and a liquid crystal material which may be a mixture of a plurality of types of nematic liquid crystal is introduced into the gap between both substrates by, for example, vacuum suction, whereby a liquid crystal layer 50 of a predetermined thickness is formed.

The production process described heretofore enables the production of the electro-optical device of the first embodiment, while achieving reduction in the number of the process steps and simplification of these steps.

Second Embodiment of Electro-optical Device

Figure 8:
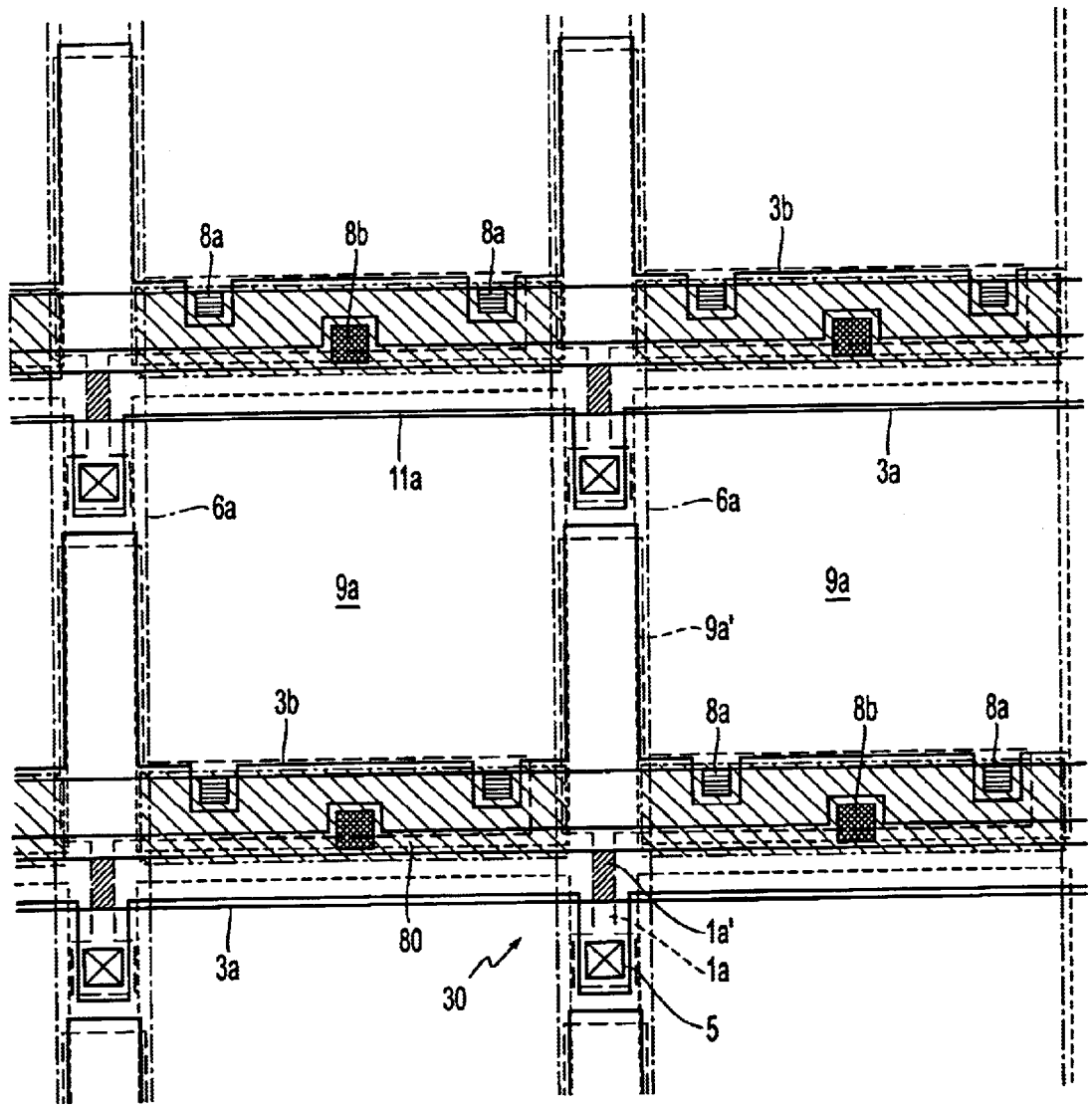
FIG. 8 is a plan view of a plurality of pixels arranged adjacent to one another on a TFT array substrate which carries data lines, scanning lines, a light-shielding film and which is incorporated in the liquid crystal device of a second embodiment.

A description will now be given of a liquid crystal device which is a second embodiment of the electro-optical device of the present invention, with specific reference to FIG. 8. FIG. 8 is a plan view of a TFT array substrate used in the second embodiment, carrying data lines, scanning lines, pixel electrodes, light-shielding films and so forth formed thereon, showing particularly a group of adjacent pixels. In FIG. 8, components or elements that are the same as those used in the first embodiment shown in FIG. 2 are denoted by the same reference numerals as those employed in the description of the first embodiment, and description of such components or elements is omitted.

Referring to FIG. 8, the contact hole 8a in the second embodiment is formed in the portion of the non-aperture region extending along the scanning line 3a, at the side of the capacitance line 3b contacting the aperture region, unlike the contact hole 8a in the first embodiment. Other portions are the same as those of the first embodiment.

Unlike the contact hole 8b, the contact hole 8a when viewed three-dimensionally is spaced from the surface of the pixel electrode 9a by a plurality of conductive layers and inter-layer insulating films. Dents and steps appearing on the surface of the pixel electrode due to the presence of the contact hole 8a are therefore inherently small. In accordance with this embodiment, therefore, it is possible to obtain an arrangement in which, while the contact hole 8a is positioned near the aperture region of each pixel when viewed in plan, the risk of short-circuiting between the lines such as the scanning line 3a and the capacitance line 3b and the barrier layer 80 is eliminated. Particularly, in this embodiment, the capacitance line 3b may have a planar configuration that is contracted at the portion corresponding to the contact hole 8a, in order to avoid narrowing entirety of the scanning line 3a and the capacitance line 3b due to the presence of the contact hole 8a, or in order to prevent the width of the non-aperture region from becoming unnecessarily large, as will be seen from FIG. 8.

Third Embodiment of Electro-optical Device

Figure 9:
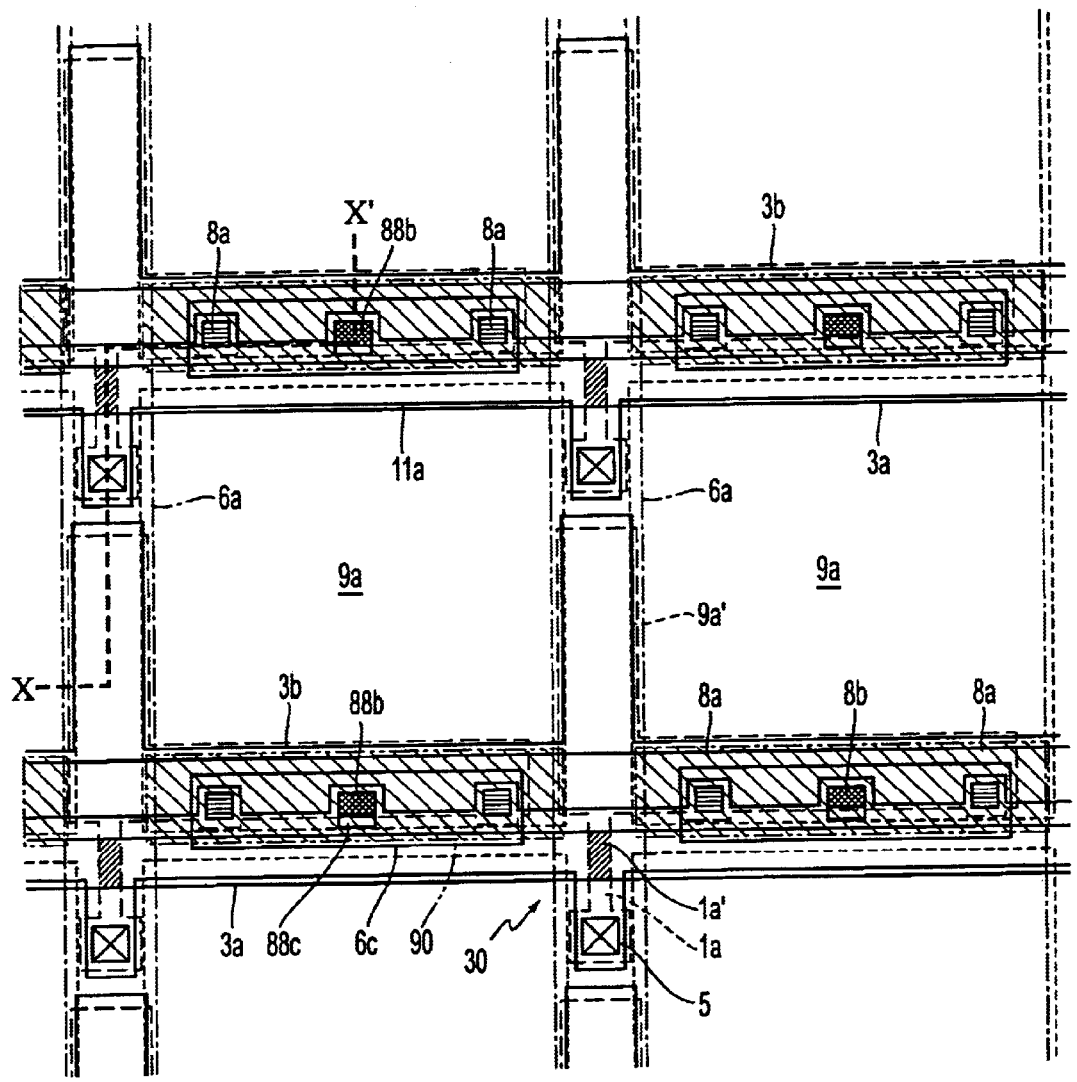
FIG. 9 is a plan view of a plurality of pixels arranged adjacent to one another on a TFT array substrate which carries data lines, scanning lines, a light-shielding film and which is incorporated in the liquid crystal device of a third embodiment.
Figure 10:
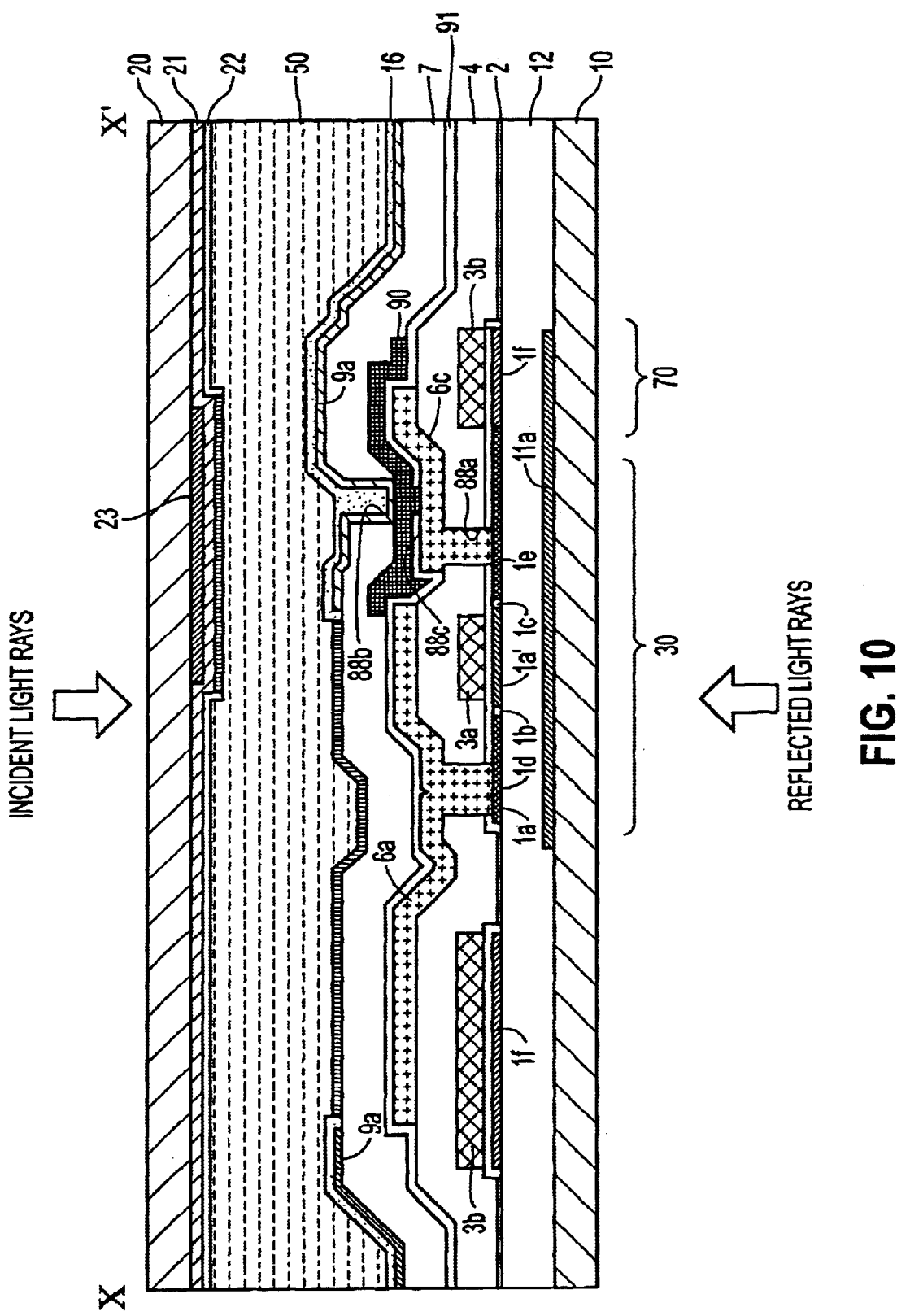
FIG. 10 is a sectional view taken along the line X—X of FIG. 9.

A description will now be given of a liquid crystal device which is a third embodiment of the electro-optical device of the present invention, with specific reference to FIGS. 9 and 10. FIG. 9 is a plan view of a TFT array substrate used in the third embodiment, carrying data lines, scanning lines, pixel electrodes, light-shielding films and so forth formed thereon, showing particularly a group of adjacent pixels. FIG. 10 is a sectional view taken along the line X—X of FIG. 9. In FIG. 10, layers and elements are shown at different scales of magnification in order to make them recognizable on the Figure. In FIGS. 9 and 10, components or elements that are the same as those used in the first embodiment shown in FIGS. 2 and 3 are denoted by the same reference numerals as those employed in the description of the first embodiment, and description of such components or elements is omitted.

Referring to FIGS. 9 and 10, the third embodiment employs a combination of a first barrier layer 6c and a second barrier layer 90, in place of the barrier layer 80 used in the first embodiment, wherein the first barrier layer 6c is constituted by the same layer as the data line 6a and electrically connected to the high-concentration drain region 1e of the semiconductor layer 1a through a contact hole 88a, while the second barrier layer 90 is connected to the pixel electrode 9a through a contact hole 88b. The first barrier layer 6c and the second barrier layer 90 oppose each other across an inter-layer insulating film 91 which is formed on the data lines 6a and the first barrier layer 6c, and are electrically connected to each other through a contact hole 88c formed in this inter-layer insulating film 91. Other portions are materially the same as those of the first embodiment.

The material usable for the barrier layer 80 of the first embodiment can suitably be used also as the material of the second barrier layer 90. In particular, when the pixel electrode 9a and the data line 6a are respectively from ITO film and Al film, further improved electrical connection is achieved when the second barrier layer 90 is formed from a high-melt-point metal such as Ti, Cr, W, Mo, Ta or the like, or a metal silicide.

In the third embodiment, therefore, electrical connection is achieved between the pixel electrode 9a and the high-concentration drain region 1e via the first barrier layer 6c and the second barrier layer 90. Further, the arrangement in which the capacitance line 3b and the first barrier layer 6c oppose each other across the first inter-layer insulating film 4 serves to increase the storage capacitance. The contact hole 88a can be located at any position in the planar region devoid of the data line. The contact hole 88b can be positioned anywhere on the inter-layer insulating film 91, thus advantageously offering a greater degree of freedom in the design.

The first barrier layer 6c which is constituted by the same film as the data line 6a may be formed, for example, by a process in which, in Step (18) of the process of the first embodiment, the contact hole 88a is formed so as to lead to the high-concentration drain region 1e and, in Step (20) of the process of the first embodiment, a photo-etching process is executed on the Al film formed in Step (19) such that a pattern which is to form the first barrier layer 6c remains above the high-concentration drain region 1e inclusive of the portion where the contact hole 88a is formed. The inter-layer insulating film 91 and the second barrier layer 90 may be formed on the data line 6a and the first barrier layer 6c, by a process which includes Steps (13) to (16) of the first embodiment of the production process.

As will be seen from FIG. 9, in this embodiment, the capacitance line 3b may have a planar configuration that is contracted at the portion corresponding to the contact hole 88a, in order to avoid narrowing entirety of the scanning line 3a and the capacitance line 3b due to presence of the contact hole 88a, or in order to prevent the width of the non-aperture region from becoming unnecessarily large due to presence of the contact hole 88a.

Fourth Embodiment of Electro-optical Device

A description will now be given of a liquid crystal device which is a fourth embodiment of the electro-optical device in accordance with the present invention, with reference to FIGS. 11(a)–(c).

In each of the preceding embodiments, the contact hole 8a and the contact hole 8b may be formed at different positions or may overlap, when viewed in plan. In particular, overlapping of these two contact holes does not cause any substantial problem provided that the region corresponding to the contact hole has been planarized. Further, in each of the described embodiments, at least one of the contact holes 8a and 8b may be arranged in plural for each of the pixels.

Use of a plurality of contact holes 8a or a plurality of contact holes 8b for an identsical pixel allows each contact hole to have a reduced diameter, while providing the same electrical conduction. Such a contact hole having a reduced diameter advantageously reduces the sizes of the dents and steps on the surface of the pixel electrode 9a correspondingly. The use of a plurality of contact holes also enables implementation of a redundant structure, thus contributing to a reduction in the ratio of production of defective products.

The fourth embodiment proposes practical examples of arrangement of the contact holes 8a and 8b of the type used in the first and second embodiments. Other portions are materially the same as those of one or more of the preceding embodiments and, therefore, are not described. In FIGS. 11(a)–(c), the hatched area shows the non-aperture region of each pixel.

Figure 11A:
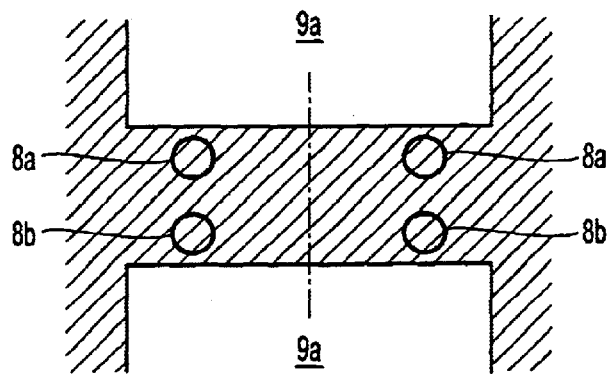
FIGS. 11(a)–(c) are diagrammatic representations of various arrangements of contact holes in a fourth embodiment of the electro-optical device.

More specifically, in FIG. 11(a), a pair of contact holes 8a and a pair of contact holes 8b are arranged at positions slightly spaced from each other in the vertical direction, such that two contact holes of each pair are positioned in symmetry with respect to adjacent data lines 6a.

Figure 11B:
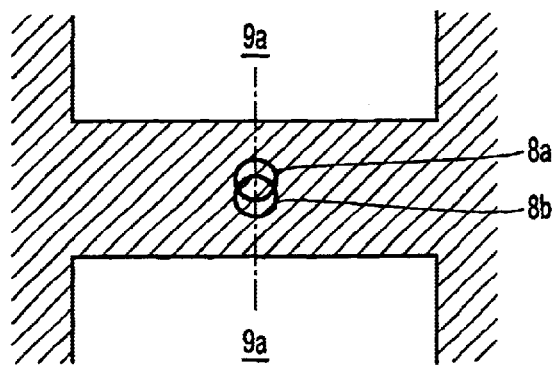

In the arrangement shown in FIG. 11(b), a single contact hole 8a and a single contact hole 8b are slightly offset from each other in the vertical direction, in symmetry with respect to the adjacent data lines 6a.

Figure 11C:
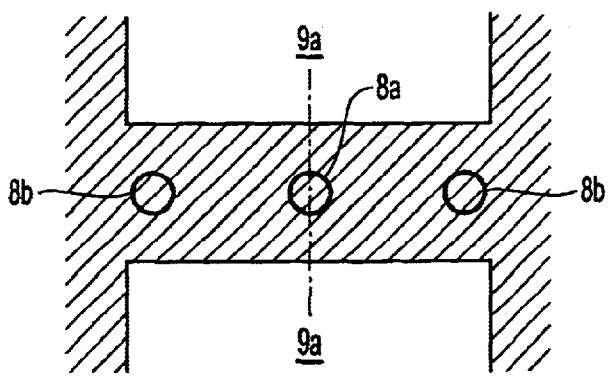

In the arrangement shown in FIG. 11(c), a single contact hole 8a and a pair of contact holes 8b are arranged with no deviation in the vertical direction, in symmetry with respect to the adjacent data lines.

In the fourth embodiment, the arrangements shown in FIGS. 11(a) to 11(c) are only illustrative, and various other arrangements in terms of number and positions of the contact holes 8a and 8b are possible, provided that such arrangements meet the requirement of the symmetry with respect to the adjacent two data lines. Obviously, various arrangements of the contact holes of this embodiment can also be applied to the arrangements of the contact hole 88a, contact hole 88b and the contact hole 88c of the third embodiment.

Fifth Embodiment of Electro-optical Device

Figure 12:
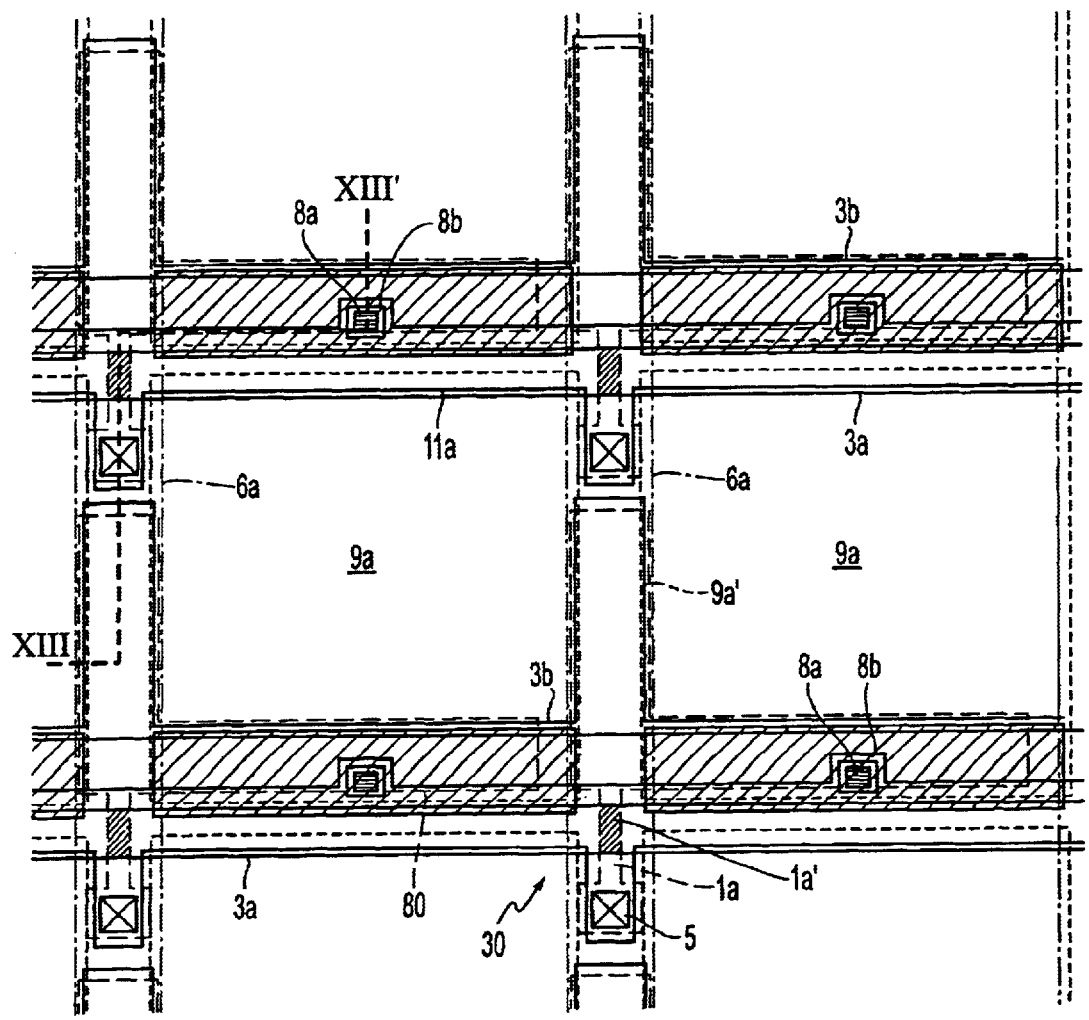
FIG. 12 is a plan view of a liquid crystal device as a fifth embodiment of the electro-optical device of the present invention.
Figure 13:
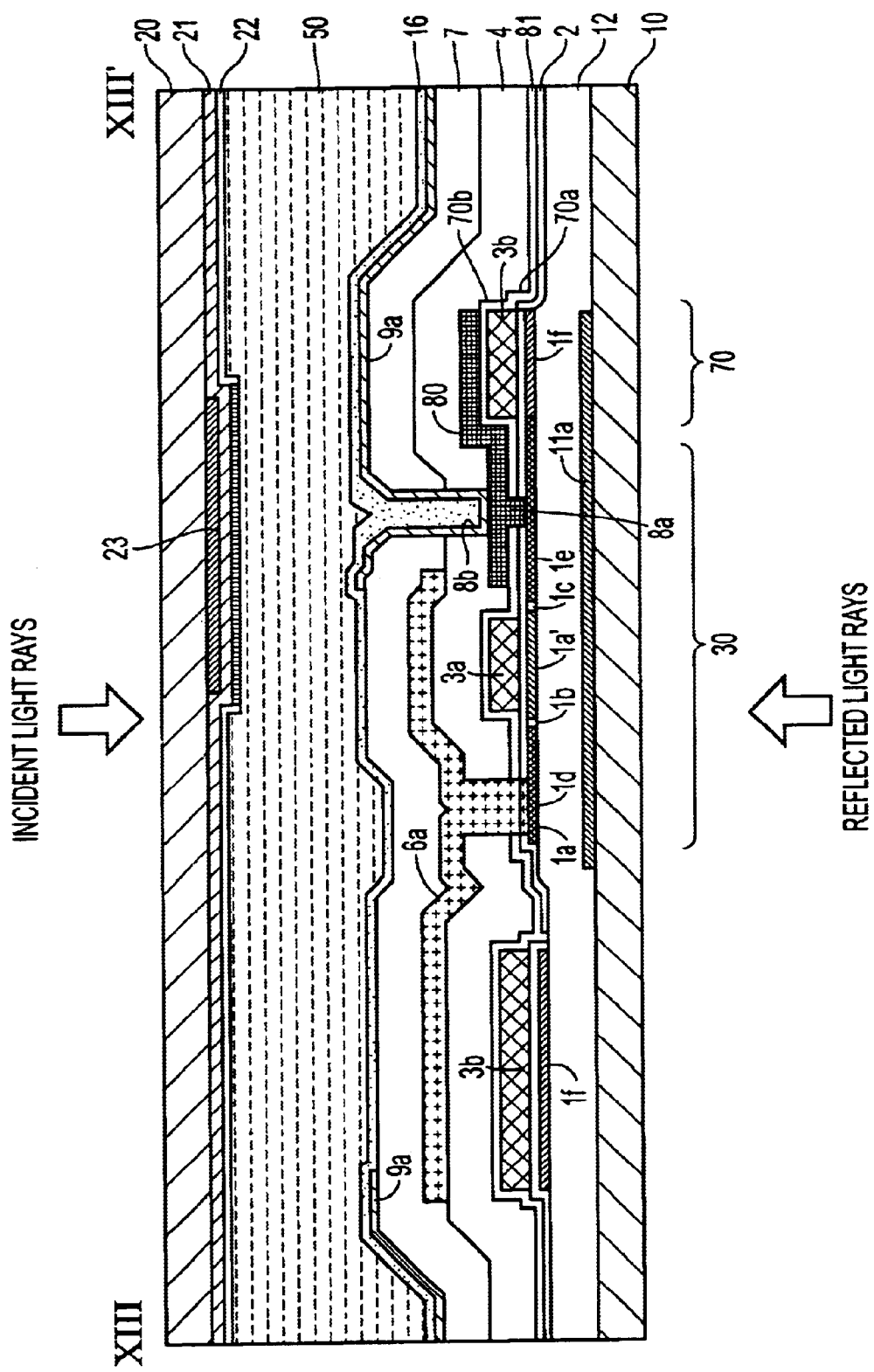
FIG. 13 is a sectional view taken along the line XIII—XIII of FIG. 12.

A description will now be given of a liquid crystal device which is a fifth embodiment of the electro-optical device of the present invention, with specific reference to FIGS. 12 and 13. FIG. 12 is a plan view of a TFT array substrate carrying data lines, scanning lines, pixel electrodes, light-shielding films and so forth formed thereon, showings particularly a group of adjacent pixels. FIG. 13 is a sectional view taken along the line XIII—XIII of FIG. 12. In the fifth embodiment shown in FIGS. 12 and 13, elements that are the same as those used in the first embodiment are denoted by the same reference numerals as those employed in the description of the first embodiment, and description of such components or elements is omitted. Thus, the description will be concentrated to the points which distinguish this embodiment from the preceding embodiments. In FIG. 13, layers and members are shown at different scales of magnification, in order to make them recognizable in the Figure.

Reference is made first to FIG. 12. Unlike the first embodiment, the fifth embodiment features that the high-concentration drain region 1e and the barrier layer 80 are connected through a single contact hole 8a, and the barrier layer 80 and the pixel electrode 9a are connected through a single contact hole 8b. In addition, the contact hole 8a and the contact hole 8b are arranged to overlap each other and, moreover, positioned substantially amidst between adjacent data lines 6a.

Thus, the fifth embodiment uses thin film in combination with the second dielectric film 81 to form the storage capacitor. Therefore, risk of forming a defective electrical connection is avoided despite the overlap of the contact holes 8a and 8b. Further, in this embodiment, each pixel can have a symmetrical nature, since both contact holes 8a and 8b are arranged to overlap at one location when viewed in plan. Further, since the capacitance line 3b cannot be formed at the position where the contact hole 8a exists, the contact hole 8b formed to overlap the contact hole 8a does not produce any undesirable effect on the capacitance line 3b. Rather, such positioning of the contact hole 8b avoids reduction in the area of the capacitance line 3b. In addition, since the dents and steps caused by presence of the contact holes 8a and 8b are concentrated to one location, it is possible to suppress occurrence of disclination of the liquid crystal.

Sixth Embodiment of Electro-optical Device

Figure 14:
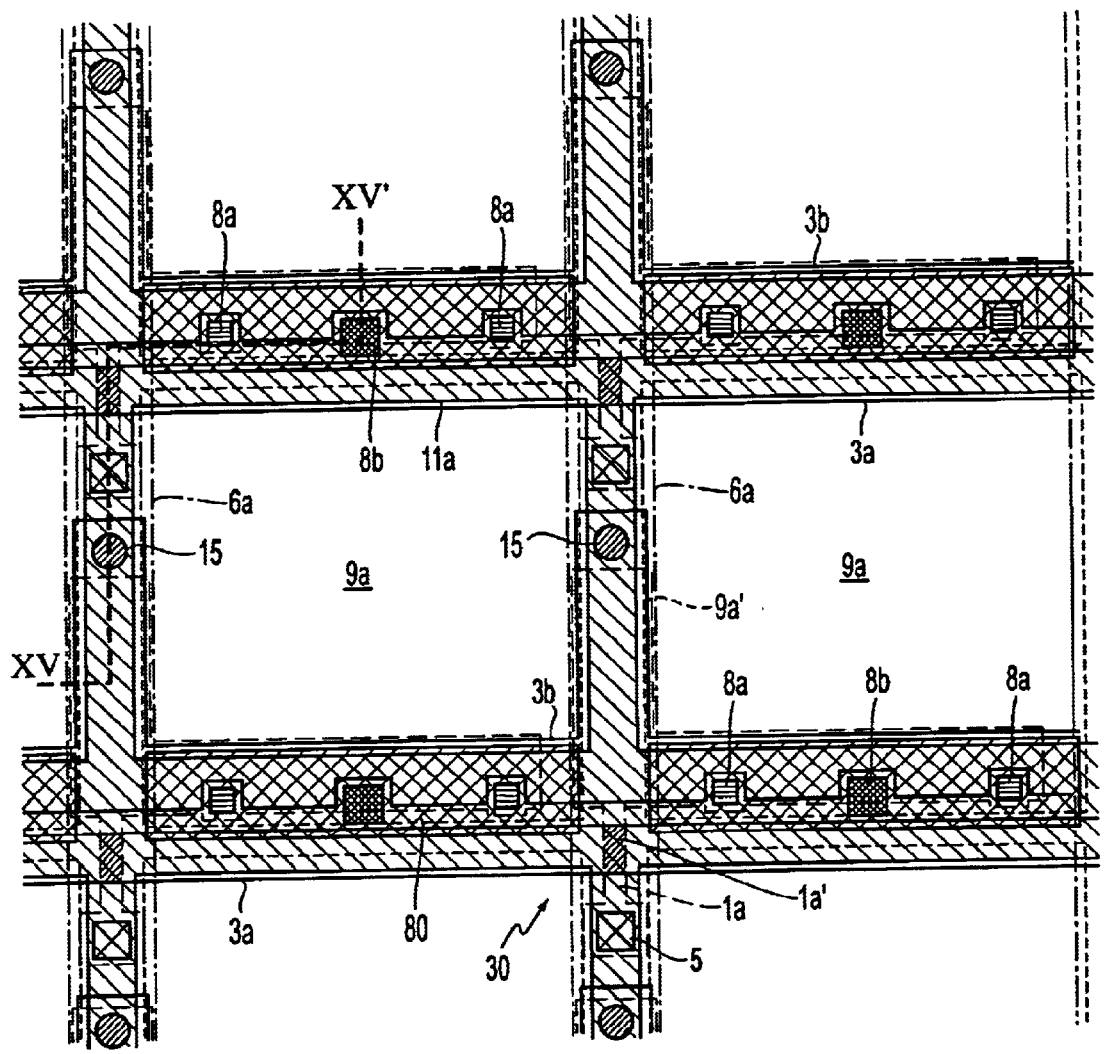
FIG. 14 is a plan view of a liquid crystal device as a sixth embodiment of the electro-optical device of the present invention.
Figure 15:
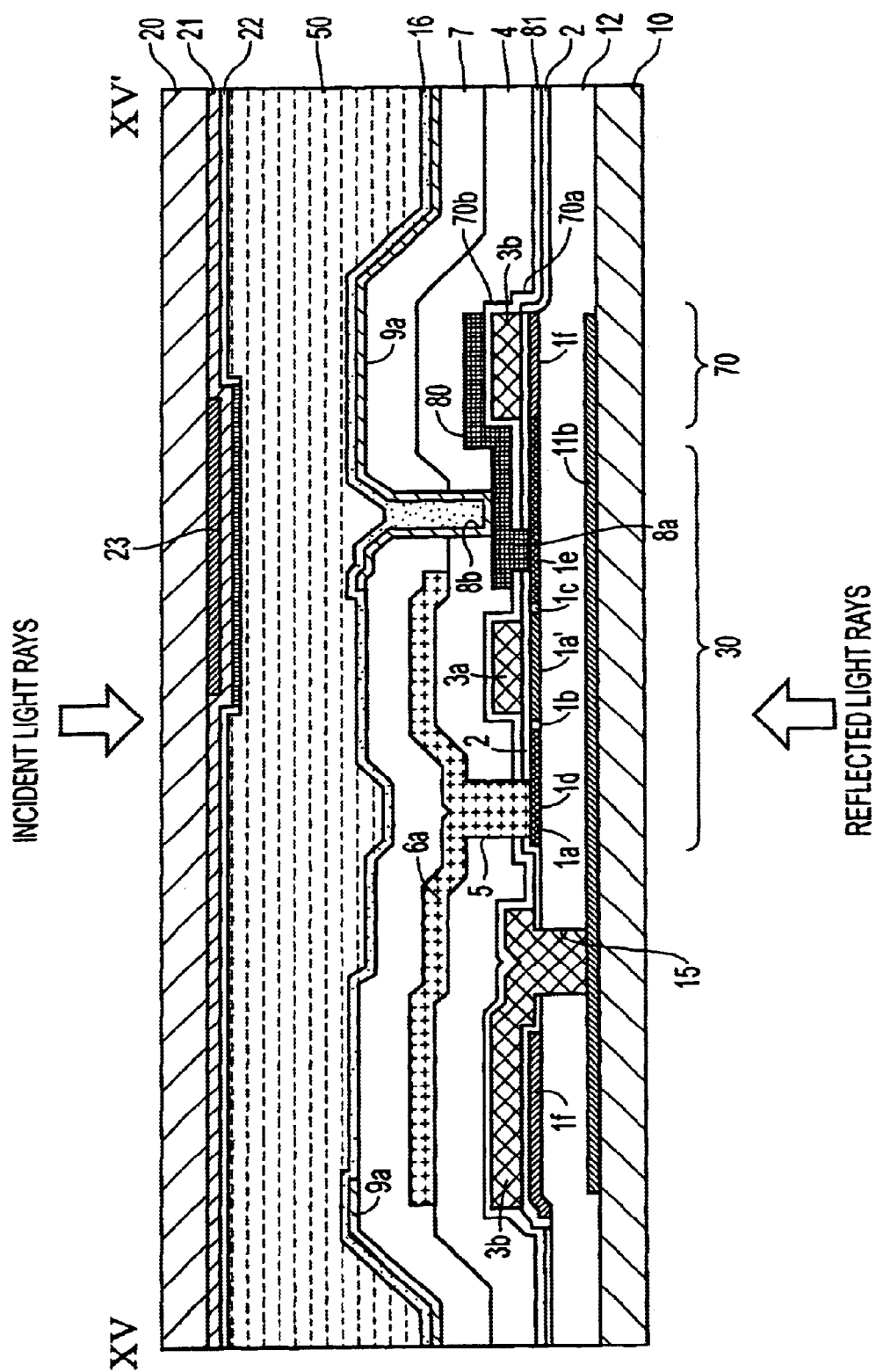
FIG. 15 is a sectional view taken along the linen XV—XV of FIG. 14.

A description will now be given of a liquid crystal device which is a sixth embodiment of the electro-optical device of the present invention, with specific reference to FIGS. 14 and 15. FIG. 14 is a plan view of a TFT array substrate carrying data lines, scanning lines, pixel electrodes, light-shielding films and so forth formed thereon, showing particularly a group of adjacent pixels. FIG. 15 is a sectional view taken along the line XV—XV of FIG. 14. In the sixth embodiment shown in FIGS. 14 and 15, elements that are the same as those used in the first embodiment are denoted by the same reference numerals as those employed in the description of the first embodiment, and description of such components or elements is omitted. In FIG. 15, layers and members are shown at different scales of magnification, in order to make them recognizable in the figure.

Referring to FIGS. 14 and 15, the sixth embodiment is discriminated from the first embodiment in that the first light-shielding film 11b is formed so as to cover the scanning line 3a, capacitance line 3b and the data line 6a when viewed from the side adjacent to the TFT array substrate 10, i.e., over the entirety of the lattice-like non-aperture region surrounding each pixel. Further, a contact hole 15 which electrically interconnects the capacitance line 3b and the first light-shielding film 11b is formed in the undercoating insulating film 12. The capacitance line 3b and the first light-shielding film 11b are connected to a constant-voltage line at a position within the peripheral region of the substrate. Other portions are materially the same as those of the first embodiment.

According to the sixth embodiment, therefore, the first light-shielding film 11b not only plays a double role of defining the pixel aperture region and providing a constant-voltage or redundant line for the capacitance line 3b, but also an additional role of reducing the resistance of the capacitance line itself, thus contributing to improvement in the image quality. This arrangement permits the pixel aperture region to be defined by the first light-shielding film 11b alone. In addition, it is possible to maintain the potentials of the capacitance line 3b and the first light-shielding film 11b at the same level, thus eliminating any undesirable effect on the image signals and TFTs 30 which otherwise may be caused by fluctuation of potentials of the capacitance line 3b and the first light-shielding film 11b. Further, the undercoating insulating film 12 intervening between the first light-shielding film 11b and the semiconductor layer 1a may be formed of a dielectric material, thereby implementing an additional storage capacitor.

The first light-shielding film 11b may be used as a substitute for the capacitance line. In such a case, the capacitance lines 3b which are formed in the same production step as the scanning lines 3a may be configured in the form of islands corresponding to the respective pixels, so as to serve as storage capacitor electrodes for these pixels. This arrangement contributes to improvement of the aperture ratio of each pixel.

The first light-shielding film 11b as described above can be formed by a step which is the same as Step (2) of the production process (see FIGS. 4 to 7), using a resist mask of a pattern different from that used in the first embodiment. The formation of the contact hole 15 may be conducted by a dry etching step such as a reactive ion etching or reactive ion beam etching which is executed between Steps (8) and (9) of the production process of the first embodiment.

Seventh Embodiment of Electro-optical Device

Figure 16:
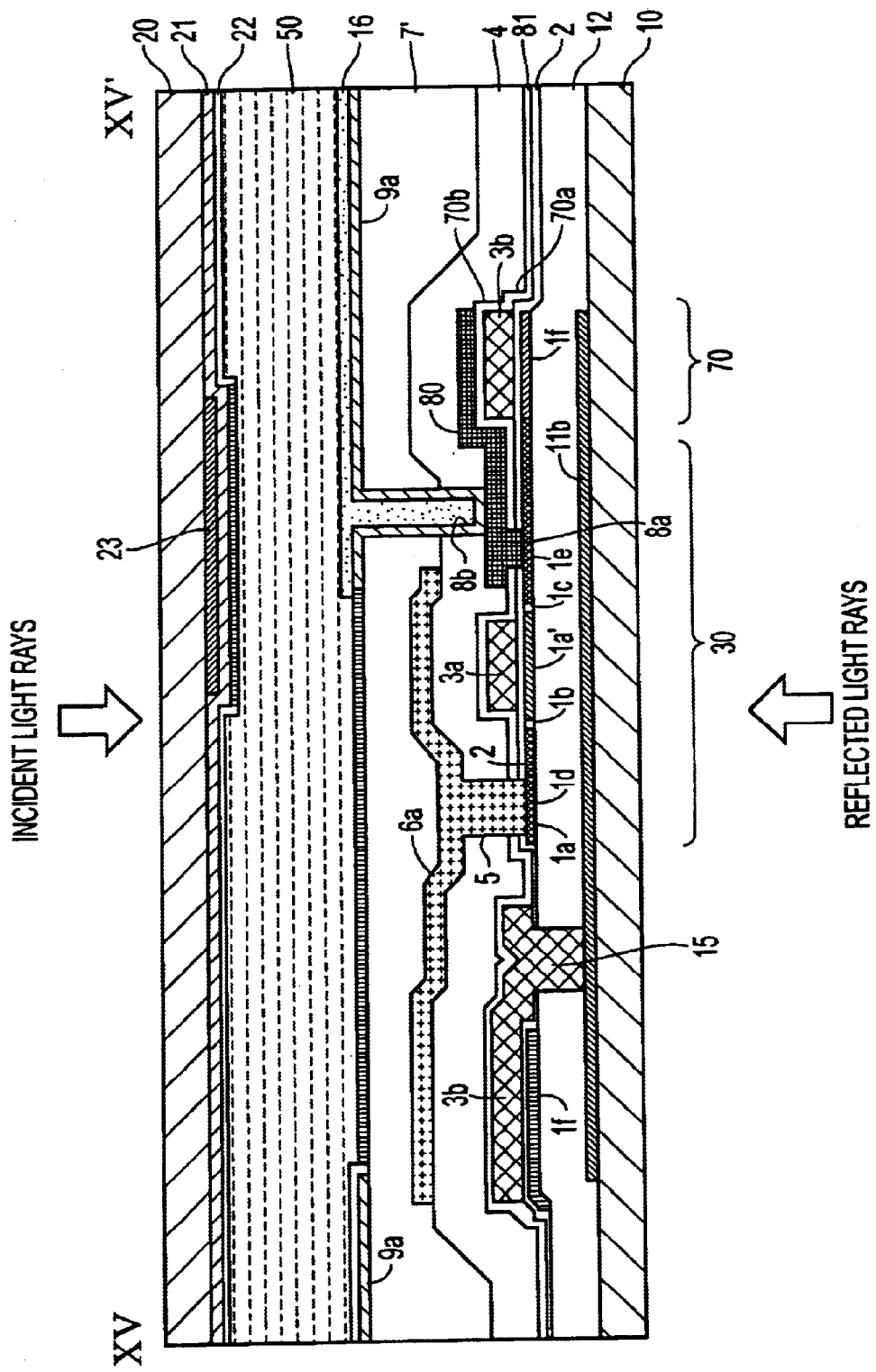
FIG. 16 is a sectional view of a liquid crystal device as a seventh embodiment of the electro-optical device of the present invention.

A description will now be given of the structure of a liquid crystal device which is a seventh embodiment of the electro-optical device in accordance with the present invention, with specific reference to FIG. 16. FIG. 16 is a sectional view of the seventh embodiment, corresponding to the sectional view of the sixth embodiment shown in FIG. 15. In the description of the seventh embodiment shown in FIG. 16, elements that are the same as those used in the sixth embodiment shown in FIG. 15 are denoted by the same reference numerals as those used in the description of the sixth embodiment, and detailed description is omitted with such elements. Further, in FIG. 16, layers and members are shown at different scales of magnification, in order to make them recognizable on the drawing.

Referring to FIG. 16, the seventh embodiment is discriminated from the first embodiment in that the second inter-layer insulating film 7' has a planarized surface. Consequently, the pixel electrode 9a and the alignment film 16 that are underlain by the second inter-layer insulating film 7' are also planarized. Other portions are the same as those of the first embodiment.

Therefore, the seventh embodiment effectively reduces the height difference between the region having the scanning line 3a, TFT 30, capacitance line 3b and so forth formed above the data line 6 and other region. Thus, the pixel electrode is planarized to correspondingly reduce occurrence of disclination in the liquid crystal layer 50. The seventh embodiment thus offers further improvement in the image quality, while enabling each pixel aperture to have a wider area.

The planarization of the second insulating film 7' may be achieved by effecting, in Step (21) of the production process of the first embodiment, a suitable processing such as a CMP processing, spin-coat processing, or reflow processing, while using an organic SOG film, inorganic SOG film and a polyimide film.

Eighth Embodiment of Electro-optical Device

Figure 17:
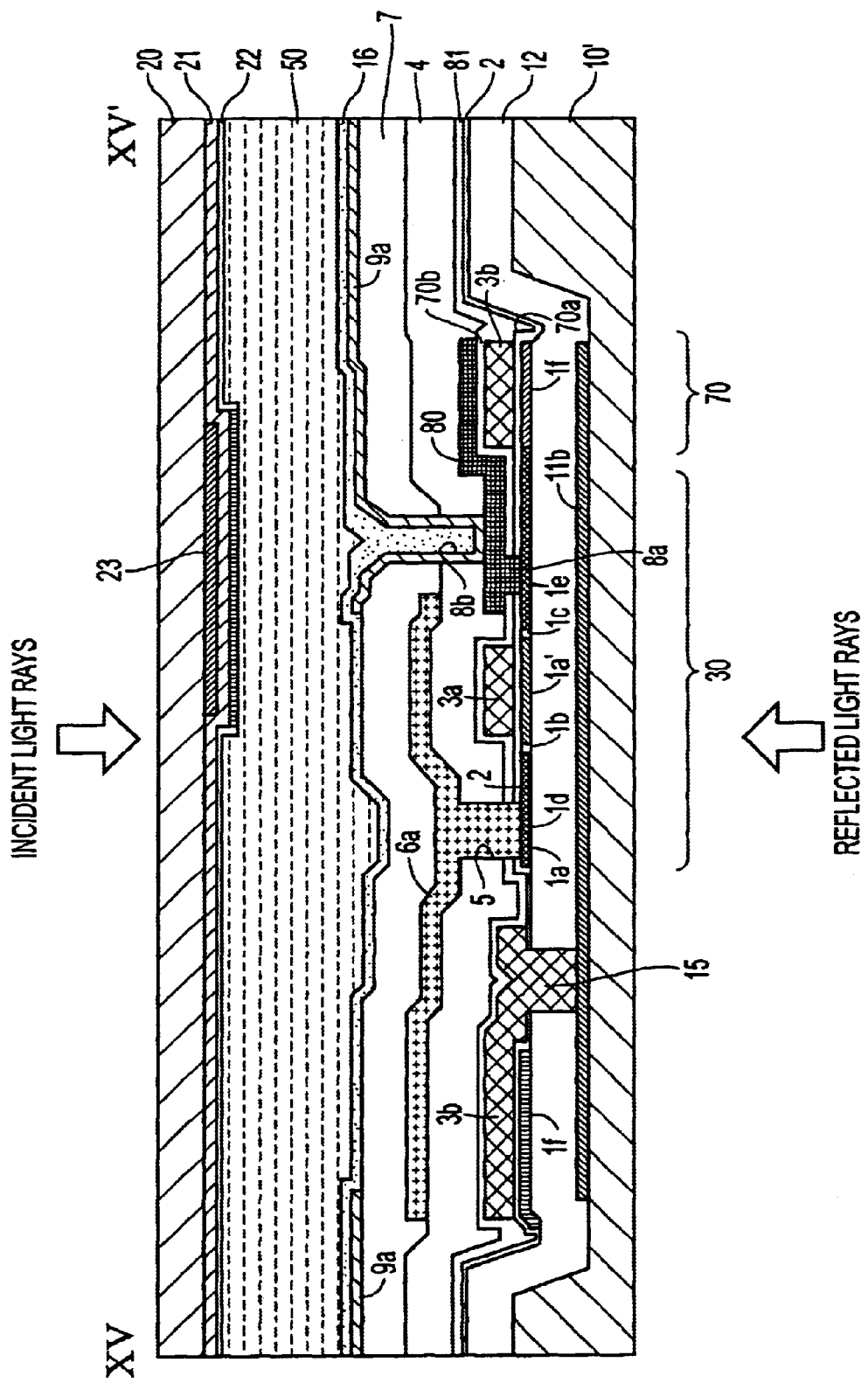
FIG. 17 is a sectional view of a liquid crystal device as an eighth embodiment of the electro-optical device of the present invention.

A description will now be given of the structure of a liquid crystal device which is an eighth embodiment of the electro-optical device in accordance with the present invention, with specific reference to FIG. 17. FIG. 17 is a sectional view of the eighth embodiment, corresponding to the sectional view of the sixth embodiment shown in FIG. 15. In the description of the eighth embodiment shown in FIG. 17, elements that are the same as those used in the sixth embodiment shown in FIG. 15 are denoted by the same reference numerals as those used in the description of the sixth embodiment, and detailed description is omitted with such elements. Further, in FIG. 17, layers and members are shown at different scales of magnification, in order to make them recognizable on the drawing.

Referring to FIG. 17, unlike the first embodiment, the eighth embodiment features that the TFT array substrate 10' has an upper surface which is recessed at at least part of the portions which oppose the data line 6a, scanning line 3a and the capacitance line 3b. Consequently, the pixel electrode 9a and the alignment film 16 that are formed on the TFT array substrate across these lines and inter-layer insulating films are also planarized. Other portions are materially the same as those of the first embodiment.

Therefore, the eighth embodiment effectively reduces the height difference between the region having the scanning line 3a, TFT 30, capacitance line 3b and so forth formed above the data line 6a and other region. Thus, the pixel electrode is planarized to correspondingly reduce occurrence of disclination in the liquid crystal layer 50. The eighth embodiment thus offers further improvement in the image quality, while enabling each pixel aperture to have a wider area.

The TFT array substrate 10' of the kind described above can be formed by effecting etching on the regions to be recessed, prior to Step (1) of the production process of the first embodiment.

As will be understood from the foregoing description, in the seventh embodiment, the upper surface of the third inter-layer insulating film 7' is planarized to finally planarize the pixel electrode, whereas, in the eighth embodiment, the planarization of the pixel electrode is achieved by using a substrate the surface of which is locally recessed. It will be understood that a similar planarization effect is obtainable when the first inter-layer insulating film or the undercoating insulating film 12 is locally recessed. Such recessing of the inter-layer insulating film can be achieved, for example, by forming the inter-layer insulating film to have a two-layered structure, and effecting etching on local portions so that etched portion where only one layer exists constitute the recess, while portion that are not etched serve as the bank, i.e., non-recessed portion. Obviously, the recessed may be formed by effecting etching on local portions of a single-layered inter-layer insulating film. Such etching can advantageously be performed with a dry etching process such as a reactive ion etching process or a reactive ion beam etching process, because such a dry etching ensures the recesses to be precisely formed in conformity with the design. In contrast, when wet etching is used alone or in combination with the dry etching, the side wall surfaces of the recessed can be tapered. The recess is filled with a polysilicon or a resist formed in late steps. The tapered wall surface of the recess effectively reduces residence of the polysilicon or the resist on the side wall surface of the recess, thus preventing reduction in the yield which otherwise may be caused by such residue.

Overall Configuration of Electro-optical Device

Figure 18:
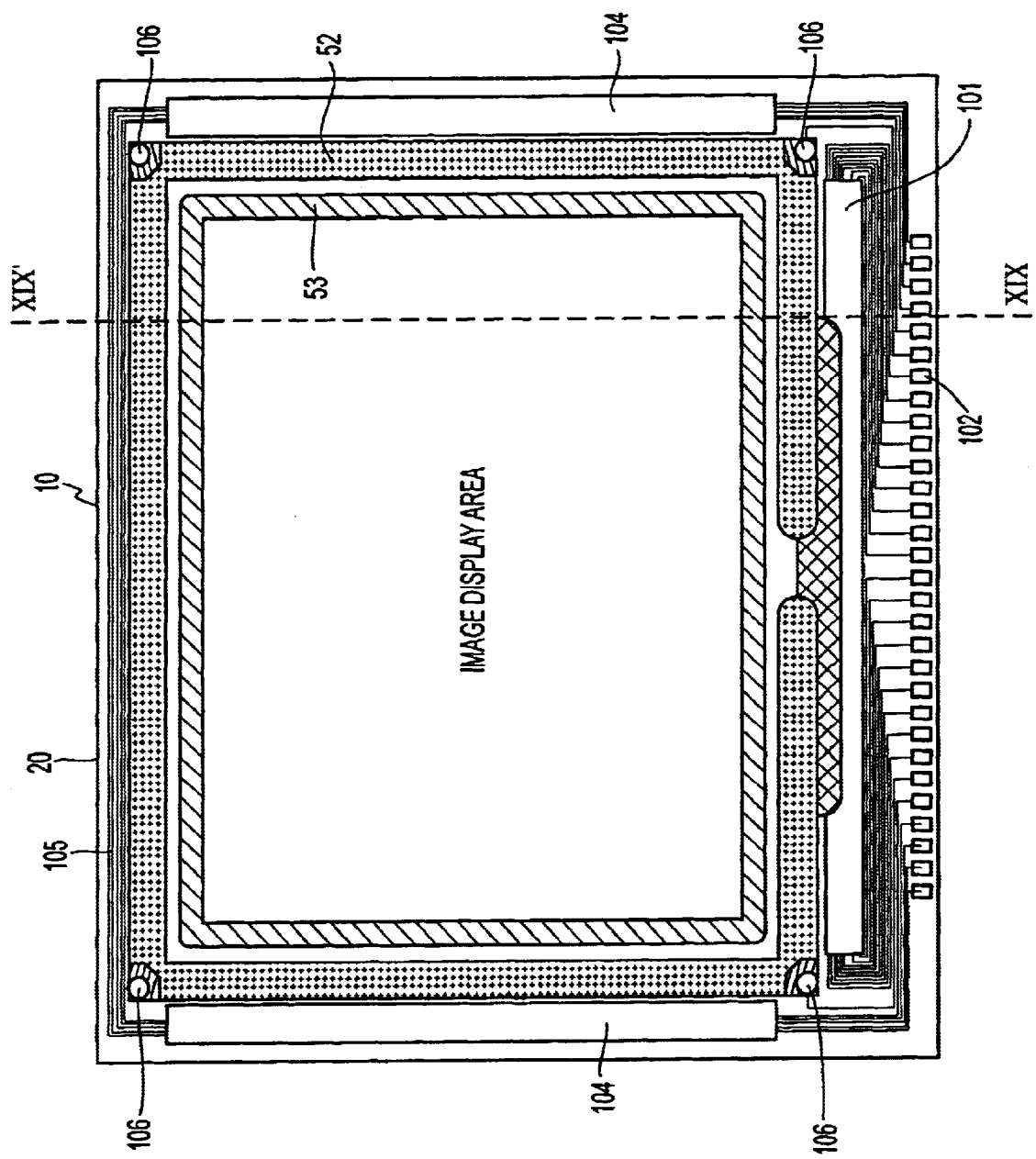
FIG. 18 is a plan view of a TFT array substrate used in the liquid crystal device of each of the embodiments, shown together with components formed thereon, as viewed from a counter substrate.
Figure 19:
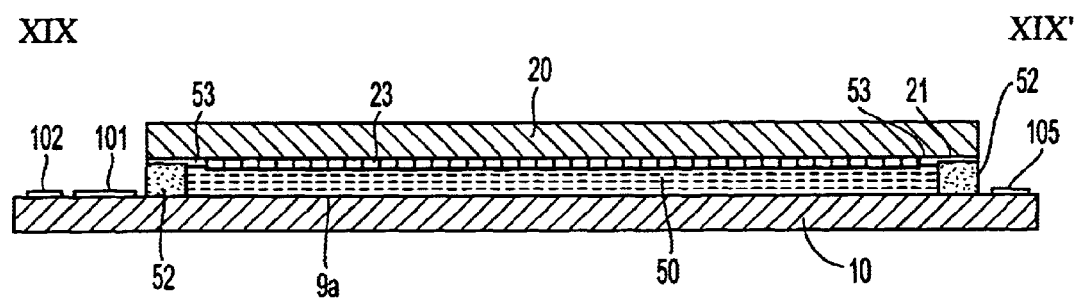
FIG. 19 is a sectional view taken along the line XIX—XIX FIG. 18.
Figure 20:
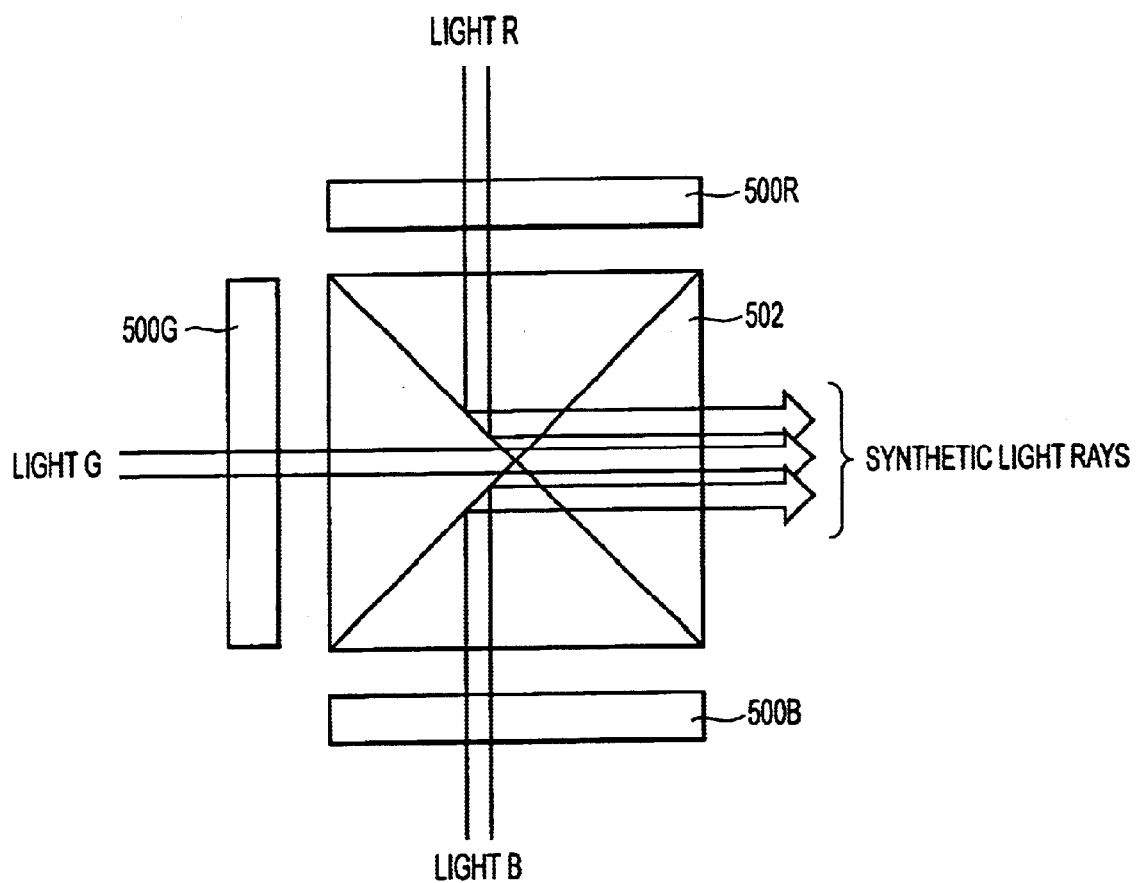
FIG. 20 is an illustration of the concept of light synthesis performed in a multi-plate-type color projector.

Overall configuration of the electro-optical device incorporating any of the embodiments described heretofore will now be described with reference to FIGS. 18 and 19. FIG. 18 is a plan view of the TFT array substrate 10 carrying various elements formed thereon, as viewed from the same side as the counter substrate 20, while FIG. 19 is a sectional view taken along the line XIX—XIX of FIG. 18.

Referring to FIG. 18, a sealing member 52 is arranged on the TFT array substrate 10 along the edges thereof. The third light-shielding film 53, which extends along the inner edge of the sealing member 52, is made of a material same as or different from that of the second light-shielding film 23 and serves as a framework that defines the image display area of the liquid crystal device. A data line driver circuit 101 is provided in the region outside the sealing member 52, together with an external circuit connector terminal 102, along one side of the TFT array substrate 10. The data line driver circuit 101 supplies image signals to the data lines 6a at suitable timing to drive these data lines. Scanning line driver circuits 104, which drive the scanning lines 3a by supplying scanning signals thereto at predetermined timing, are arranged in the region outside the sealing member 52, along two sides of the TFT array substrate 10 adjacent to the above-mentioned one side of the TFT array substrate 10. Obviously, only one scanning line driver circuit 104 may be arranged on one side of the TFT array substrate 10, provided that the delay of the scanning signals to be supplied to the scanning lines 3a does not matter. It is also possible to adopt a dual arrangement of the data line driver circuit 104, such that two such driver circuits 101 are arranged on two opposing sides of the image display area. For instance, the arrangement may be such that odd-numbered data lines 6a are supplied with the image signals from the data line driver circuit which is disposed along one side of the image display area, while even-numbered data lines 6a are supplied with the image signals from the data line driver circuit which is disposed along the opposing side of the image display area. This interdigitated driving of the data lines serves to enlarge the area occupied by the data line driver, making it possible to implement a circuit having an intricate circuit structure.

The remainder one side of the TFT array substrate 10 is used to carry a plurality of wires 105 that interconnect the scanning line driver circuits 104 arranged on opposing sides of the image display area. A conductive member 106 for providing electrical connection between the TFT array substrate 10 and the counter substrate 20 is provided in at least one of the corners of the counter substrate 20. As will be seen from FIG. 19, the counter substrate 20 having a contour substantially identical to that of the sealing member 52 shown in FIG. 18 is bonded to the TFT array substrate 10 by means of the sealing member 52. The TFT array substrate 10 may carry various circuits in addition to the data line driver circuit 101 and the scanning line driver circuit 104, such as a sampling circuit for supplying image signals to a plurality of data lines 6a, a pre-charge circuit for supplying a pre-charge signal of a predetermined voltage to a plurality of data lines 6a prior to the supply of the image signals, and a testing circuit which is used for checking the quality and to find defect of the device in the course of production or prior to shipment. In the described embodiments of the invention, the second light-shielding film 23 on the counter substrate 20 should be formed to have a size smaller than that of the light-shielding region on the TFT array substrate 10, so that the second light-shielding film 23 may easily be removed if the use of the liquid crystal device requires such removal.

In the embodiments described heretofore with reference to FIGS. 1 to 19, instead of providing the data line driver circuit 101 and the scanning line driver circuit 104 on the TFT array substrate 10, an alternative arrangement may be used in which the liquid crystal device is connected to a driver LSI mounted on a TAB (Tape Automated Bonding) substrate, via an anisotropic conductive film provided on a peripheral part of the TFT array polarizer plate may be arranged in predetermined directions on the light-incident side of the counter substrate 10 and on the light emitting side of the TFT array substrate 10, depending on the operation mode such as TN (Twisted Nematic) mode, VA (Vertically Aligned) mode, PDLC (Polymer Dispersed Liquid Crystal) mode and so forth, and mode of use such as normally-while or normally-black mode.

The electro-optical device of each of the described embodiment can be used as, for example, a color displaying image projector. Three units of such liquid crystal device are used as light valves for R, G and B colors. The R, G and B light valves respectively receive color light rays of the respective colors, that has been formed through color-separating dichroic mirrors for R, G and B colors. In the described embodiment, therefore, the counter substrate 20 is not provided with any color filter. The present invention, however, does not exclude provision of an R, G and B color filters on these liquid crystal devices. In such a case, the color filter is formed on the counter substrate 20 together with a filter protective film, at predetermined regions opposing pixel electrodes 9a and devoid of the second light-shielding film 23.

Provision of such color filters makes it possible to adapt the electro-optical devices of each embodiment for use on appliances other than the projector, e.g., a color liquid crystal television display of direct-viewing type or reflection type. It is also possible to form a matrix of micro-lenses on the counter substrate 20, such that each one micro-lens corresponds to one pixel. Alternatively, a color filter layer of a color resist may be formed under the pixel electrodes on the TFT array substrate 10 corresponding to R, G and B colors. This arrangement enhances the light condensation efficiency for the incidents light rays, thus achieving an electro-optical device having a higher brightness of the display. It is also possible to deposit on the counter substrate 20 a plurality of interference layers having different refractive indices, thus forming a dichroic filter which forms the R, G and B color light rays by interference of the light rays. Use of the counter substrate having such a dichroic filter provides a color electro-optical device having even more higher brightness of the display.

In the electro-optical device of each of the embodiments described heretofore, incidents light rays are received from the side of the device adjacent to the counter substrate 20. However, since the electro-optical device o the described embodiment has the first light-shielding film 11a, the arrangement also may be such that the light rays impinges from the side adjacent to the TFT array substrate 10 and emits from the side adjacent to the counter substrate 20. Thus, the described electro-optical device, even when mounted in a liquid crystal projector, light rays from impinging upon the channel region 1a', low-concentration source region 1b and the low-concentration drain region 1c of the semiconductor layer 1a, thus offering higher quality of the display image. Conventionally, it has been necessary to separately provide a polarizer plate having an AR (Anti Reflection) coating or to adhere an AR film to the reverse side of the TFT array substrate 10, in order to prevent reflection at the reverse side of the TFT array substrate 10. In each of the described embodiments, in contrast, the first light-shielding film 11a is formed between the surface of the TFT array substrate and at least the channel region 1a', low-concentration source region 1b and the low-concentration drain region 1c of the semiconductor layer 1a. In each embodiment, therefor, it is not necessary to use an AR-coated polarizer plate or an AR film, or to use an AR-treated substrate as the TFT array substrate 10.

Thus, the present invention serves to reduce the cost incurred for the materials, and can prevent reduction in the yield attributable to inclusion of dust or damaging which otherwise may be incurred during bonding of a polarizer plate. The electro-optical device of each of the described embodiments also excels in light-fastness, which effectively eliminates degradation of the image quality due to cross-talk by the light rays which otherwise may be caused when a bright light source is used or when the rate of utilization of light is increased through polarization by the use of a polarization beam splitter.

In the foregoing description, the switching element associated with each pixel is assumed to be a stagger-type or co-planar-type polysilicon TFT. Obviously, however, the features of each of the described embodiment can effectively be used when the switching element is an inverse-stagger-type TFT or amorphous silicon TFT.

INDUSTRIAL APPLICABILITY

As will be understood from the foregoing description, in the electro-optical device in accordance with the first aspect, the positions where the second contact holes are formed are exquisitely determined, so that the tendency of generation of defects due to dentss and steps on the pixel electrode surfaces caused by the presence of the second contact holes is stabilized in each and all the pixels. This effectively suppresses the risk of degradation of the display image quality which otherwise may be caused by enhancement of defects beyond a predetermined limit to a noticeable extent at a certain location of the image display area due to the presence of the contact holes, and thus prevents the whole electro-optical device from becoming defective. In the electro-optical device of the second aspect, the positions where the first contact hole are formed are exquisitely determined, so that undesirable effect of dents and steps on the pixel electrode surface that are produced as a result of the presence of each first contact hole can hardly reach the aperture region of each pixel. This effectively eliminates the risk of degradation of the display image quality due to the presence of such first contact holes, and prevents the whole electro-optical device from becoming defective. Further, the electro-optical device in accordance with the third aspect features a structure which suppresses occurrence of defect of the whole device, through an exquisite consideration of the positions where the first contact holes are formed. This also effectively eliminates the risk of degradation of the display image quality due to the presence of such first contact holes, and prevents the whole electro-optical device from becoming defective.

It is also to be appreciated that the method of the present invention for producing an electro-optical device makes it possible to produce an electro-optical device with fewer and simpler steps of process.

What is claimed is:

1. An electro-optical device, comprising:
    a substrate above which are formed a plurality of scanning lines, a plurality of data lines, thin-film transistors and pixel electrodes arranged at positions corresponding to points where said scanning lines and said data lines cross each other;
    a semiconductor layer constituting a thin-film transistor having an extended region formed along said scanning line;
    a conductive layer electrically connected between a semiconductor layer, constituting a thin-film transistor, and a pixel electrode, said conductive layer that is one of electrodes of a storage capacitor like island, overlapped said extended region of said semiconductor layer;
    a first contact hole provided electrical connection between said pixel electrode and said conductive layer; and
    a plurality of second contact holes provide electrical connection between said extending region of said semiconductor layer and said conductive layer;
    said first contact hole being formed symmetrically between two adjacent data lines when viewed in plan, said plurality of second contact holes formed symmetrically between two adjacent data lines, and said first contact hole and one of said plurality of second contact holes overlap each other when viewed in plan.

2. The electro-optical device according to claim 1,
    said conductive layer, a first inter-layer insulating film, a data line, a second inter-layer insulating film, and said pixel electrode being laminated in order on a scanning line and one electrode of said storage capacitor,
    said conductive layer and said pixel electrode being electrically connected to each other through said first contact hole formed in said first inter-layer insulating film and said second inter-layer insulating film.

3. The electro-optical device according to claim 2, wherein a first insulating thin film constituting a first dielectric film is provided between a first storage capacitor electrode constituted by the same film as said semiconductor layer and a second storage capacitor electrode which constitutes said one of the electrodes of said storage capacitor, and wherein a second insulating thin film constituting a second dielectric film is provided between said second storage capacitor electrode and a third storage capacitor electrode constituted by part of said conductive layer.

4. The electro-optical device according to claim 2 or 3, wherein said scanning line and said second storage capacitor electrode are arranged substantially side-by-side when viewed in plan, and wherein a second contact hole for providing electrical connection between said semiconductor layer and said conductive layer is formed at a position on said second storage capacitor electrode adjacent to an aperture region of said pixel when viewed in plan.

5. The electro-optical device according to claim 2, a plurality of at least one of said first contact hole and said second contact hole being arranged for each pixel.

6. The electro-optical device according to claim 1,
    a first inter-layer insulating film, a data line, said conductive layer, a second inter-layer insulating film, and said pixel electrode being laminated in order on a scanning line and one electrode of said storage capacitor,
    said conductive layer and said pixel electrode being electrically connected to each other through said first contact hole formed in said second inter-layer insulating film.

7. The electro-optical device according to claim 6, wherein a storage capacitor is added to said pixel electrode, wherein a first dielectric film is provided between a first storage capacitor electrode constituted by the same film as said semiconductor layer and a second storage capacitor electrode which constitutes said one of the electrodes of said storage capacitor, and wherein said first inter-layer insulating film constituting a second dielectric film is provided between said second storage capacitor electrode and a third storage capacitor electrode constituted by part of said conductive layer.

8. The electro-optical device according to claim 7, said scanning line and said second storage capacitor electrode being arranged substantially side-by-side when viewed in plan, and a second contact hole being formed at a position which is between said scanning line and said second storage capacitor electrode when viewed in plan.

9. The electro-optical device according to claim 8, wherein said first contact hole is disposed substantially midst a width between said scanning line and the second storage capacitor electrode when viewed in plan.

10. The electro-optical device according to one of claims 2 to 9, wherein said first contact hole and said second contact hole are arranged to overlap at least partially when viewed in plan.

11. The electro-optical device according to one of claims 2 to 10, wherein one of said electrodes of said storage capacitor is a capacitance line to which a predetermined potential is applied.

12. The electro-optical device according to one of claims 1 to 10, wherein said conductive layer is arranged to be substantially in symmetry with respect to a central axis line of a region between adjacent data lines.

13. The electro-optical device according to one of claims 2 to 9, wherein at least one of said first inter-layer insulating film and said second inter-layer insulating film is recessed at least at a portion confronting part of said data line, or at least one of said first inter-layer insulating film and second inter-layer insulating film has been subjected to a planarizing treatment so as to planarize a surface of said pixel electrode.

14. The electro-optical device according to one of claims 1 to 13, wherein said conductive layer is formed from a conductive light-shielding film.

15. The electro-optical device according to claim 14, wherein said conductive layer defines at least part of an aperture region of said pixel.

16. The electro-optical device according to one of claims 1 to 13, wherein said conductive layer is formed of a conductive polysilicon film.

17. The electro-optical device according to one of claims 1 to 16, wherein said conductive layer has a laminate film having at least two layers including a conductive silicon film and a high-melt-point metal.

18. An electro-optical device, comprising:
   a substrate above which are formed a plurality of scanning lines, a plurality of data lines, thin-film transistors and pixel electrodes arranged at positions corresponding to points where said scanning lines and said data lines cross each other;
   a semiconductor layer constituting a thin-film transistor, having an extended region formed along said scanning line;
   a conductive layer electrically connected between a semiconductor layer constituting a thin-film transistor and a pixel electrode, said conductive layer that is one of electrodes of a storage capacitor like island, overlapped said extended region of said semiconductor layer;
   a first contact hole provided electrical connection between said pixel electrode and said conductive layer; and
   a plurality of second contact holes provide electrical connection between said extending region of said semiconductor layer and said conductive layer;
   said first contact hole being formed to be positioned in the center of two adjacent data lines when viewed in plan, and said plurality of second contact holes formed symmetrically between two adjacent data lines when viewed in plan.

19. The electro-optical device according to claim 18,
   said conductive layer, a first inter-layer insulating film, a data line, a second inter-layer insulating film, and said pixel electrode being laminated in order on a scanning line and one electrode of said storage capacitor,
   said conductive layer and said pixel electrode being electrically connected to each other through said first contact hole formed in said first inter-layer insulating film and said second inter-layer insulating film.

20. The electro-optical device according to claim 19, further comprising:
   a first insulating thin film constituting a first dielectric film provided between a first storage capacitor electrode constituted by a film forming said semiconductor layer and a second storage capacitor electrode which constitutes said one electrode of said storage capacitor; and
   a second insulating thin film constituting a second dielectric film provided between said second storage capacitor electrode and a third storage capacitor electrode constituted by part of said conductive layer.

21. The electro-optical device according to claim 19,
   said scanning line and a second storage capacitor electrode being arranged substantially side-by-side when viewed in plan, and
   said second contact hole being formed at a position on said second storage capacitor electrode adjacent to an aperture region when viewed in plan.

22. The electro-optical device according to claim 19,
   at least one of said first inter-layer insulating film and said second inter-layer insulating film is recessed at least at a portion confronting part of said data line, or
   at least one of said first inter-layer insulating film and second inter-layer insulating film being subjected to a planarizing treatment so as to planarize a surface of said pixel electrode.

23. The electro-optical device according to claim 18,
   a first inter-layer insulating film, a data line, said conductive layer, a second inter-layer insulating film, and said pixel electrode being laminated in order on a scanning line and one electrode of said storage capacitor,
   said conductive layer and said pixel electrode being electrically connected to each other through said first contact hole formed in said second inter-layer insulating film.

24. The electro-optical device according to claim 23, further comprising
   a first dielectric film provided between a first storage capacitor electrode constituted by a film forming said semiconductor layer and a second storage capacitor electrode which constitutes said one electrode of said storage capacitor,
   said first inter-layer insulating film constituting a second dielectric film being provided between said second storage capacitor electrode and a third storage capacitor electrode constituted by part of said conductive layer.

25. The electro-optical device according to claim 23,
   at least one of said first contact hole and said second contact hole being arranged in plural for each pixel.

26. The electro-optical device according to claim 18,
   said first contact hole and said second contact hole being arranged to overlap at least partially when viewed in plan.

27. The electro-optical device according to claim 18,
   said conductive layer being formed from a conductive light-shielding film.

28. The electro-optical device according to claim 27,
   said conductive layer defining at least part of an aperture region.

29. The electro-optical device according to claim 18,
   said conductive layer comprising laminate film having at least two layers including a conductive silicon film and a high-melt point metal.

30. An electro-optical device, comprising:
   a substrate above which forms a plurality of scanning lines, a plurality of data lines, thin-film transistors and pixel electrodes arranged at positions corresponding to points where said scanning lines and said data lines cross each other;

a semiconductor layer constituting a thin-film transistor, having an extended region formed along said scanning line;

a plurality of conductive layers electrically connected between a semiconductor layer constituting, a thin-film transistor, and a pixel electrode, said plurality of conductive layers overlapped said extended region of said semiconductor layer;

a first contact hole that provides electrical connection between said pixel electrode and said conductive layer of pixel electrode side; and a plurality of second contact holes that provides electrical connection between said extending region of said semiconductor layer and said conductive layer of semiconductor side;

said first contact hole being formed symmetrically between two adjacent data lines when viewed in plan, and said plurality of second contact holes formed symmetrically between two adjacent data lines when viewed in plan.

31. The electro-optical device according to claim 30, further comprising:

a third contact hole connected between said conductive layer of pixel electrode side and said conductive layer of semiconductor side, said third contact hole and said first contact hole being arranged to overlap at least partially when viewed in plan.

32. An electro-optical device, comprising:

a substrate above which are formed a plurality of scanning lines, a plurality of data lines, thin-film transistors and pixel electrodes arranged at positions corresponding to points where said scanning lines and said data lines cross each other;

a semiconductor layer constituting a thin-film transistor, having an extended region formed along said scanning line;

a plurality of conductive layers electrically connected between a semiconductor layer constituting, a thin-film transistor, and a pixel electrode, said plurality of conductive layers overlapped said extended region of said semiconductor layer;

a first contact hole that provided electrical connection between said pixel electrode and said conductive layer of pixel electrode side; and a plurality of second contact holes provides electrical connection between said extending region of said semiconductor layer and said conductive layer of semiconductor side;

said first contact hole being formed to be positioned in the center of two adjacent data lines when viewed in plan, and said plurality of second contact holes formed symmetrically between two adjacent data lines when viewed in plan.

33. The electro-optical device according to claim 32, further comprising:

a third contact hole connected between said conductive layer of pixel electrode side and said conductive layer of semiconductor side, said third contact hole and said first contact hole being arranged to overlap at least partially when viewed in plan.

* * * * *